US008232028B2

(12) United States Patent
Askham

(10) Patent No.: US 8,232,028 B2
(45) Date of Patent: Jul. 31, 2012

(54) HOLOGRAPHIC STORAGE MEDIUM AND METHOD FOR GATED DIFFUSION OF PHOTOACTIVE MONOMER

(75) Inventor: Fredric R. Askham, Loveland, CO (US)

(73) Assignee: Inphase Technologies, Inc., Longmont, CO (US)

( * ) Notice: Subject to any disclaimer, the term of this patent is extended or adjusted under 35 U.S.C. 154(b) by 473 days.

(21) Appl. No.: 12/508,784

(22) Filed: Jul. 24, 2009

(65) Prior Publication Data
US 2010/0020373 A1 Jan. 28, 2010

Related U.S. Application Data

(60) Provisional application No. 61/083,254, filed on Jul. 24, 2008.

(51) Int. Cl.
*G03H 1/02* (2006.01)
*G02B 6/138* (2006.01)

(52) U.S. Cl. .............. 430/1; 430/2; 430/321; 359/3; 385/143

(58) Field of Classification Search ................ None
See application file for complete search history.

(56) References Cited

U.S. PATENT DOCUMENTS

| 3,668,663 | A * | 6/1972 | Chandross et al. ............ 365/119 |
| 5,219,710 | A | 6/1993 | Horn et al. |
| 5,292,620 | A | 3/1994 | Booth et al. |
| 5,932,045 | A | 8/1999 | Campbell |
| 6,482,551 | B1 | 11/2002 | Dhar et al. |
| 6,780,546 | B2 | 8/2004 | Trentler et al. |
| 2002/0089067 | A1 * | 7/2002 | Crane et al. .................... 257/778 |
| 2004/0027625 | A1 * | 2/2004 | Trentler et al. ................... 359/3 |
| 2005/0026079 | A1 * | 2/2005 | Kihara et al. ............... 430/280.1 |
| 2005/0182148 | A1 * | 8/2005 | Gaud et al. ......................... 522/1 |
| 2005/0227021 | A1 | 10/2005 | Harding et al. |
| 2006/0281021 | A1 * | 12/2006 | Riley et al. .................... 430/269 |
| 2007/0166625 | A1 * | 7/2007 | Cole et al. ......................... 430/1 |
| 2007/0248890 | A1 | 10/2007 | Cole et al. |
| 2008/0020478 | A1 | 1/2008 | Lowe et al. |
| 2009/0253050 | A1 * | 10/2009 | Trentler et al. .................... 430/2 |

OTHER PUBLICATIONS

Veniaminov et al., "hologram amplification by diffusion destruction of out of phase periodic structures", Opt. Spectrosc. (USSR) vol. 70(4) pp. 505-508 (Apr. 1991).*
Livingston et al., "Reversible photochemical dimerization of acenapthylene . . . ", J Phys. Chem. vol. 71(3) pp. 541-547 (1967).*
Chen et al., "synthesis and reversible photocleavage of novel polyurethanes containing coumarin dimer componenets" J. Poly. Sic A., Poly. Chem., vol. 35 pp. 613-624 (1997).*
Fomine et al., "Polymers from coumarins . . . ", Macromol. Chem., Phys., vol. 198 pp. 3065-3075 (1997).*

(Continued)

*Primary Examiner* — Martin Angebranndt
(74) *Attorney, Agent, or Firm* — Vedder Price PC; Ajay A. Jagtiani

(57) ABSTRACT

An optical medium is provided. The optical medium comprises: a diffusion-controlling matrix framework; at least one photoactive monomer attached to the diffusion-controlling matrix framework in a first state of the optical medium, wherein the at least one photoactive monomer is released from the diffusion-controlling matrix framework by photo cleavage, producing a second state of the optical medium, in which diffusion of the photoactive monomer through the optical medium is possible; and wherein the at least one photoactive monomer is then polymerized or reattached to the diffusion-controlling matrix, giving a third state of the optical medium, when exposed to photo-polymerizing light.

50 Claims, 5 Drawing Sheets

OTHER PUBLICATIONS

PCT/US2009/051655 International Search Report and the Written Opinion of the International Searching Authority, or the Declaration, mailed Sep. 17, 2009.
McLeod, et al. "Micro-Holographic Multi-Layer Optical Disk Data Storage," *International Symposium on Optical Memory and Optical Data Storage* (Jul. 2005).
Psaltis, et al., "Holographic Memories," *Scientific American* (Nov. 1995).
Dhar, K., et al., "Recording Media That Exhibit High Dynamic Range for Holographic Storage," *Optics Letters*, 24, (1999): pp. 487 et. seq.
Shelby, "Media Requirements for Digital Holographic Data Storage," *Holographic Data Storage*, Section 1.3 (Coufal, Psaltis, Sincerbox Eds. (2003).
Smothers, et al., "Photopolymers for Holography," SPIE OE/Laser Conference, Los Angeles, California, pp. 1212-1303, (1990).
Booth, B., "Optical Interconnection Polymers," in Polymers for Lightwave and Integrated Optics, Technology and Applications, L.A. Hornak ed., Marcel Dekker, Inc. (1992).
Hariharan, P., Optical Holographic: Principles, Techniques and Applications, Cambridge University Press, Cambridge, p. 44, (1991).
Bochet, C.G., "Photolabile Protecting Groups and Linkers," J.Chem. Soc., Perkin Trans. 1, pp. 125-142 (2002).
Mayer, G., et al., "Biologically Active Molecules with a Light Switch," Angew. Chem. Inst. Ed. 2006, 45, pp. 4900-4921.
Pelliccioli, A.P., et al., "Photoremovable Protecting Groups: Reaction Mechanisms and Applications," Photochem. Photobiol. Sci., 2002, I, pp. 441-458.
Adams, S.R., et al., "Controlling Cell Chemistry with Caged Compounds," Annu. Rev. Physiol. 1993, 55, pp. 755-784.
Fedoryak, Olesya D., "Brominated Hydroxyquinoline as a Photoliable Protecting Group with Sensitivity to Multiphoton Excitation," Organic Letters vol. 4, No. 20, pp. 3419-3422, 2002.
Denk, Winfried et al., "Two-Photon Laser Scanning Fluorescence Microscopy," Science, 248, 1990 pp. 73-76.
Furuta, T., et al., "Brominated 7-hydroxycoumarin-4-ylmethyls: Photolabile Protecting Groups with Biologically Useful Cross-Sections for Two Photo Photolysis," Proc. Natl. Acad. Sci. 96, pp. 1193-1200, Feb. 1999.
Solymar, L., et al., "Volume Holography and Volume Gratings," Academic Press, pp. 315-327, 1981.
Ludman, Jacques E., et al., "Very Thick Holographic Nonspatial Filtering of Laser Beams," Opt. Eng. 36(6), pp. 1700-1705, Jun. 1997.
Kuzmenko, A.B., "Kramers-Kronig Constrained Variational Analysis of Optical Spectra," Sci. Instruments, 76, 2005.
Soldera, A., et al., "Mid-infrared Optical Properties of a Polymer film: Comparison Between Classical Molecular Simulations, Spectrometry, and Ellipsometry Techniques," Polymer, 43, pp. 6027-6035, 2002.
Cushing, B. L. et al., "Recent Advances in the Liquid-Phase Synthesis of Inorganic Nanoparticles," Chem. Rev. 104, pp. 3893-3946, 2004.
Young-Wook, J., et al., "Shape Control of Semiconductor and Metal Oxide Nanocrystals through Onhydrolytic Colloidal Routes," Angew. Chem. Int. Ed, 45, pp. 3414-3439, 2006.
Masala, O., et al., "Synthesis Routes for Large Volumes of Nanoparticles," Annu. Rev. Mater. Res., 34, pp. 41-81, 2004.
Kickelbick, G., "Concepts for the Incorporation of Inorganic Building Blocks into Organic Polymers on a Nanoscale," Prog. Polym. Sci. 28, pp. 83-114, 2003.

* cited by examiner

HOLOGRAPHIC STORAGE MEDIUM AND METHOD FOR GATED DIFFUSION OF PHOTOACTIVE MONOMER

CROSS-REFERENCE TO RELATED APPLICATIONS

This application makes reference to and claims the priority date of co-pending U.S. Provisional Patent Application No. 61/083,254, entitled "Method for Allowing Localized Gating of Diffusion Properties" filed Jul. 24, 2008. The entire disclosure and contents of the above application is hereby incorporated by reference. This application also makes reference to the following U.S. Patent Applications: U.S. Provisional Patent Application No. 61/082,328, entitled "METHOD TO MODIFY AND APPLY EDGE SEAL MATERIALS TO LAMINATED MEDIA SO THAT THE RESULTING SEAL HAS MINIMAL EFFECT ON THE SHAPE OF THE MEDIA AFTER EXPOSURE TO ELEVATED TEMPERATURES," filed Jul. 21, 2008; U.S. Provisional Patent Application No. 61/060,890, entitled "A SYSTEM AND DEVICES FOR IMPROVING EXTERNAL CAVITY DIODE LASERS USING WAVELENGTH AND MODE SENSORS AND COMPACT OPTICAL PATHS," filed Jun. 12, 2008; U.S. Provisional Patent Application No. 61/054,613, entitled "A METHOD FOR COMPENSATING FOR THERMAL EFFECTS OF A PHOTOPOLYMER BY USING ADAPTIVE ENERGY CONTROL," filed May 20, 2008. U.S. Provisional Patent Application No. 61/028,628, entitled "SERVO FOR HOLOGRAPHIC DATA STORAGE," filed Feb. 14, 2008. U.S. Provisional Patent Application No. 60/980,604, entitled "LAYOUT METHOD FOR MULTIPLEXED HOLOGRAMS," filed Oct. 17, 2007; U.S. patent application Ser. No. 12/210,476, entitled "LAYOUT METHOD FOR MULTIPLEXED HOLOGRAMS" filed Sep. 15, 2008; U.S. Provisional Patent Application No. 60/855,754, entitled "EMULATION OF DISSIMILAR REMOVABLE MEDIUM STORAGE DEVICE TYPES ASSISTED BY INFORMATION EMBEDDED IN THE LOGICAL FORMAT," filed Sep. 1, 2006; U.S. patent application Ser. No. 11/849,658, entitled "EMULATION OF DISSIMILAR REMOVABLE MEDIUM STORAGE DEVICE TYPES ASSISTED BY INFORMATION EMBEDDED IN THE LOGICAL FORMAT," filed Sep. 4, 2007; U.S. Provisional Patent Application No. 60/831,692, entitled "EXTERNAL CAVITY DIODE LASER COLLIMATION GROUP ADJUSTMENT" filed Jul. 19, 2006; U.S. patent application Ser. No. 11/826,517, entitled "COLLIMATION LENS GROUP ADJUSTMENT FOR LASER SYSTEM" filed Jul. 16, 2007, now U.S. Pat. No. 7,495,838, issued Feb. 24 2009; U.S. Provisional Patent Application No. 60/802,530, entitled "HIGH-SPEED ELECTROMECHANICAL SHUTTER" filed May 25, 2006. U.S. patent application Ser. No. 11/752,804, entitled "HIGH-SPEED ELECTROMECHANICAL SHUTTER" filed May 25, 2007; U.S. Provisional Patent Application No. 60/793,322, entitled "METHOD FOR DESIGNING INDEX CONTRASTING MONOMERS" filed Apr. 20, 2006; U.S. patent application Ser. No. 11/738,394, entitled "INDEX CONTRASTING-PHOTOACTIVE INDEX-CONTRASTING MONOMERS, AND ARTICLES AND METHODS USING SAME" filed Apr. 20, 2007; U.S. Provisional Patent Application No. 60/780,354, entitled "EXTERNAL CAVITY LASER" filed Mar. 9, 2006; U.S. patent application Ser. No. 11/716,002, entitled "EXTERNAL CAVITY LASER" filed Mar. 9, 2007. U.S. Provisional Patent Application No. 60/779,444, entitled "METHOD FOR DETERMINING MEDIA ORIENTATION AND REQUIRED TEMPERATURE COMPENSATION IN PAGE-BASED HOLOGRAPHIC DATA STORAGE SYSTEMS USING DATA PAGE BRAGG DETUNING MEASUREMENTS" filed Mar. 7, 2006; U.S. patent application Ser. No. 11/714,125, entitled "METHOD FOR DETERMINING MEDIA ORIENTATION AND REQUIRED TEMPERATURE COMPENSATION IN PAGE-BASED HOLOGRAPHIC DATA STORAGE SYSTEMS USING DATA PAGE BRAGG DETUNING MEASUREMENTS" filed Mar. 6, 2007; U.S. Provisional Patent Application No. 60/778,935, entitled "MINIATURE FLEXURE BASED SCANNERS FOR ANGLE MULTIPLEXING" filed Mar. 6, 2006. U.S. Provisional Patent Application No. 60/780,848, entitled "MINIATURE FLEXURE BASED SCANNERS FOR ANGLE MULTIPLEXING" filed Mar. 10, 2006; U.S. Provisional Patent Application No. 60/756,556, entitled "EXTERNAL CAVITY LASER WITH A TUNABLE HOLOGRAPHIC ELEMENT" filed Jan. 6, 2006; U.S. patent application Ser. No. 11/649,801, entitled "An EXTERNAL CAVITY LASER WITH A TUNABLE HOLOGRAPHIC ELEMENT" filed Jan. 5, 2007; U.S. Provisional Patent Application No. 60/738,597, entitled "METHOD FOR HOLOGRAPHIC DATA RETRIEVAL BY QUADRATURE HOMODYNE DETECTION" filed Nov. 22, 2005; U.S. patent application Ser. No. 11/562,533, entitled "METHOD FOR HOLOGRAPHIC DATA RETRIEVAL BY QUADRATURE HOMODYNE DETECTION" filed Nov. 22, 2006; U.S. patent application Ser. No. 11/402,837, entitled "ARTICLE COMPRISING HOLOGRAPHIC MEDIUM BETWEEN SUBSTRATES HAVING ENVIRONMENTAL BARRIER SEAL AND PROCESS FOR PREPARING SAM" filed Dec. 2, 2005; U.S. patent application Ser. No. 11/291,845, entitled "ARTICLE COMPRISING HOLOGRAPHIC MEDIUM BETWEEN SUBSTRATES HAVING ENVIRONMENTAL BARRIER SEAL AND PROCESS FOR PREPARING SAM" filed Dec. 2, 2005; U.S. Provisional Patent Application No. 60/728,768, entitled "METHOD AND SYSTEM FOR INCREASING HOLOGRAPHIC DATA STORAGE CAPACITY USING IRRADIANCE-TAILORING ELEMENT" filed Oct. 21, 2005; U.S. patent application Ser. No. 11/319,425, entitled "METHOD AND SYSTEM FOR INCREASING HOLOGRAPHIC DATA STORAGE CAPACITY USING IRRADIANCE-TAILORING ELEMENT" filed Dec. 27, 2005; U.S. Provisional Patent Application No. 60/684,531, entitled "METHODS FOR MAKING A HOLOGRAPHIC STORAGE DRIVE SMALLER, CHEAPER, MORE ROBUST AND WITH IMPROVED PERFORMANCE" filed May 26, 2005; U.S. patent application Ser. No. 11/440,368, entitled "REPLACEMENT AND ALIGNMENT OF LASER" filed May 25, 2006. U.S. patent application Ser. No. 11/440,369, entitled "HOLOGRAPHIC DRIVE HEAD ALIGNMENTS" filed May 25, 2006; U.S. patent application Ser. No. 11/440,365, entitled "LASER MODE STABILIZATION USING AN ETALON" filed May 25, 2006; U.S. patent application Ser. No. 11/440,366, entitled "ERASING HOLOGRAPHIC MEDIA" filed May 25, 2006; U.S. patent application Ser. No. 11/440,367, entitled "POST-CURING OF HOLOGRAPHIC MEDIA" filed May 25, 2006; U.S. patent application Ser. No. 11/440,371, entitled "SENSING ANGULAR ORIENTATION OF HOLOGRAPHIC MEDIA IN A HOLOGRAPHIC MEMORY SYSTEM" filed May 25, 2006; U.S. patent application Ser. No. 11/440,372, entitled "SENSING ABSOLUTE POSITION OF AN ENCODED OBJECT" filed May 25, 2006; U.S. patent application Ser. No. 11/440,357, entitled "CONTROLLING THE TRANSMISSION AMPLITUDE PROFILE OF A COHERENT LIGHT BEAM IN A HOLO- GRAPHIC MEMORY SYSTEM" filed May 25, 2006; U.S. patent application Ser. No. 11/440,358, entitled "OPTICAL DELAY LINE IN HOLOGRAPHIC DRIVE" filed May 25, 2006; U.S. patent application Ser. No. 11/440,359, entitled "HOLOGRAPHIC DRIVE HEAD AND COMPONENT ALIGNMENT" filed May 25, 2006; U.S. patent application Ser. No. 11/440,448, entitled "IMPROVED OPERATIONAL MODE PERFORMANCE OF A HOLOGRAPHIC MEMORY SYSTEM" filed May 25, 2006; U.S. patent application Ser. No. 11/440,447, entitled "PHASE CONJUGATE RECONSTRUCTION OF A HOLOGRAM" filed May 25, 2006; U.S. patent application Ser. No. 11/440,446, entitled "METHODS AND SYSTEMS FOR LASER MODE STABILIZATION" filed May 25, 2006, now U.S. Pat. No. 7,379,571, issued Jul. 8, 2008; U.S. patent application Ser. No. 11/440,370, entitled "ILLUMINATIVE TREATMENT OF HOLOGRAPHIC MEDIA" filed May 25, 2006; U.S. patent application Ser. No. 11/447,033, entitled "LOADING AND UNLOADING MECHANISM FOR DATA STORAGE CARTRIDGE AND DATA DRIVE" filed Jun. 6, 2006; U.S. patent application Ser. No. 11/283,864, entitled "DATA STORAGE CARTRIDGE LOADING AND UNLOADING MECHANISM, DRIVE DOOR MECHANISM AND DATA DRIVE" filed Nov. 22, 2006; U.S. patent application Ser. No. 11/237,883, entitled "LOW CTE MEDIA FOR HOLOGRAPHIC RECORDING BY PROVIDING A SLIP LAYER BETWEEN THE MEDIA AND ITS SUBSTRATES" filed Sep. 29, 2005; U.S. patent application Ser. No. 11/261,840, entitled "SHORT STACK RECORDING IN HOLOGRAPHIC MEMORY SYSTEMS" filed Dec. 2, 2005; U.S. patent application Ser. No. 11/067,010, entitled "HIGH FIDELITY HOLOGRAM DEVELOPMENT VIA CONTROLLED POLYMERIZATION" filed Feb. 28, 2005; U.S. Provisional Patent Application No. 60/576,381, entitled "METHOD FOR ORGANIZING AND PROTECTING DATA STORED ON HOLOGRAPHIC MEDIA BY USING ERROR CONTROL AND CORRECTION TECHNIQUES AND NEW DATA ORGANIZATION STRUCTURES" filed Jun. 3, 2004; U.S. patent application Ser. No. 11/139,806, entitled "DATA PROTECTION SYSTEM" filed May 31, 2005; U.S. patent application Ser. No. 11/140,151, entitled "MULTI-LEVEL FORMAT FOR INFORMATION STORAGE" filed May 31, 2005. U.S. application Ser. No. 10/866,823, entitled "THERMOPLASTIC HOLOGRAPHIC MEDIA" filed Jun. 15, 2004. The entire disclosure and contents of the above applications are hereby incorporated by reference.

FIELD OF THE INVENTION

The present invention relates generally to a holographic storage medium comprising at least one photoactive index-contrasting monomer attached to a diffusion-controlling matrix framework to provide controlled or gated diffusion of the photoactive monomer. The present invention also relates generally to a method for subjecting the holographic storage medium to photo cleavage to release and allow diffusion of the photoactive index-contrasting monomer through the holographic storage medium prior to a write operation. The holographic storage medium is then exposed to photoinitiating recording light to cause the photoactive index-contrasting monomer to polymerize within the diffusion controlling matrix framework after the write operation is completed.

BACKGROUND

Developers of information storage devices and methods continue to seek increased storage capacity. As part of this development, holographic memory systems have been suggested as alternatives to conventional memory devices. Holographic memory systems may be designed to record data as one bit of information (i.e., bit-wise data storage). See McLeod et al. "Micro-Holographic Multi-Layer Optical Disk Data Storage," *International Symposium on Optical Memory and Optical Data Storage* (July 2005). Holographic memory systems may also be designed to record an array of data that may be a 1-dimensional linear array (i.e., a 1×N array, where N is the number linear data bits), or a 2-dimension array commonly referred to as a "page-wise" memory system. Page-wise data storage or memory systems may involve the storage and readout of an entire two-dimensional representation, e.g., a page of data. Typically, recording light passes through a two-dimensional array of low and high transparency areas representing data, and the system stores, in three dimensions, the pages of data holographically as patterns of varying refractive index imprinted into a storage medium. See Psaltis et al., "Holographic Memories," *Scientific American*, November 1995, where holographic systems are discussed generally, including page-wise memory systems.

In a holographic data storage system, information is recorded by making changes to the physical (e.g., optical) and chemical characteristics of the holographic storage medium. These changes in the holographic medium take place in response to the local intensity of the recording light. That intensity is modulated by the interference between a data-bearing beam (the data beam) and a non-data-bearing beam (the reference beam). The pattern created by the interference of the data beam and the reference beam forms a hologram which may then be recorded in the holographic storage medium. If the data beam is encoded by passing the data beam through, for example, a spatial light modulator (SLM), the hologram(s) may be recorded in the holographic storage medium as an array of light and dark squares or pixels. The holographic storage medium or at least the recorded portion thereof with these arrays of light and dark pixels may be subsequently illuminated with a reference beam (sometimes referred to as a reconstruction beam) of the same or similar wavelength, phase, etc., so that the recorded data may be read.

One type of holographic storage medium used recently for such holographic data storage systems are photosensitive polymer films. Photosensitive polymer films are considered attractive recording media candidates for high density holographic data storage. These photosensitive polymer films have a relatively low cost, are easily processed and may be designed to have large index contrasts with high photosensitivity. These photosensitive polymer films may also be fabricated with the dynamic range, media thickness, optical quality and dimensional stability required for high density applications. See, e.g., L. Dhar et al, "Recording Media That Exhibit High Dynamic Range for Holographic Storage," *Optics Letters*, 24, (1999): pp. 487 et. seq; Smothers et al., "Photopolymers for Holography," *SPIE OE/Laser Conference*, (Los Angeles, Calif., 1990), pp. 1212-03.

The holographic storage media described in Smothers et al., supra contain a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light. During writing (recording) of data into the holographic medium, the monomer polymerizes in the exposed regions. Due to the lowering of the monomer concentration caused by the polymerization, photoactive monomers from the dark, unexposed regions of the material diffuses to the exposed regions. The polymerization and resulting diffusion create a refractive index change, thus forming the hologram representing the data. An important aspect to these systems is the mass transport from one region to another to create a large change in refractive index, which may provide a distinct advantage over photochromic systems. Unfortunately, the continued mass transport may produce negative effects after the writing process has been completed.

The characteristics and capabilities of the holographic storage medium may depend upon or be affected by a number of factors, and especially the nature, properties, composition, etc., of the holographic storage medium. For example, the optical and chemical characteristics of the holographic storage medium may affect how the holographic storage medium absorbs different wavelengths of light, the speed with which a particular wavelength of light is absorbed, how well or uniformly the medium records the holograms with respect to the particular wavelength of light, etc. In addition, the recording characteristics of the holographic storage medium may change as the various chemical components present in the holographic storage medium are used up or formed, as the holographic storage medium ages over time, etc. All of these factors may affect and may make less optimal the characteristics and capabilities of the holographic storage medium to record and/or read data.

SUMMARY

According to a first broad aspect of the present invention, there is provided an optical medium comprising: a diffusion-controlling matrix framework; at least one photoactive monomer attached to the diffusion-controlling matrix framework in a first state of the optical medium, wherein the at least one photoactive monomer is released from the diffusion-controlling matrix framework by photo cleavage, producing a second state of the optical medium, in which diffusion of the photoactive monomer through the optical medium is possible; and wherein the at least one photoactive monomer is then polymerized or reattached to the diffusion-controlling matrix, yielding a third state of the optical medium, when exposed to photo-polymerizing light.

According to a second broad aspect of the present invention, there is provided an optical medium comprising: a diffusion-controlling matrix framework; at least one photoactive index-contrasting monomer attached to the diffusion-controlling matrix framework in a first state of the holographic storage medium, wherein the at least one photoactive index-contrasting monomer is released from the diffusion-controlling matrix framework by photo-cleavage, producing a second state of the holographic storage medium, in which diffusion of the photoactive index-contrasting monomer through the holographic storage medium is possible; and wherein the at least one photoactive index-contrasting monomer is then polymerized or reattached to the diffusion-controlling matrix, yielding a third state of the holographic storage medium, when exposed to photo-polymerizing light.

According to a third broad aspect of the present invention, there is provided a process comprising the following steps:
a. subjecting a optical medium to photo-cleavage to release at least one photoactive monomer attached to a diffusion-controlling matrix framework by exposing the optical medium to photo-cleaving light; and
b. polymerizing or attaching the at least one photoactive index-contrasting monomer with the diffusion-controlling matrix by exposing the photoactive index-contrasting monomer to photo-polymerizing light.

BRIEF DESCRIPTION OF THE DRAWINGS

Embodiments of the present invention will be described in conjunction with the accompanying drawings, in which.

DETAILED DESCRIPTION

Figure 1:
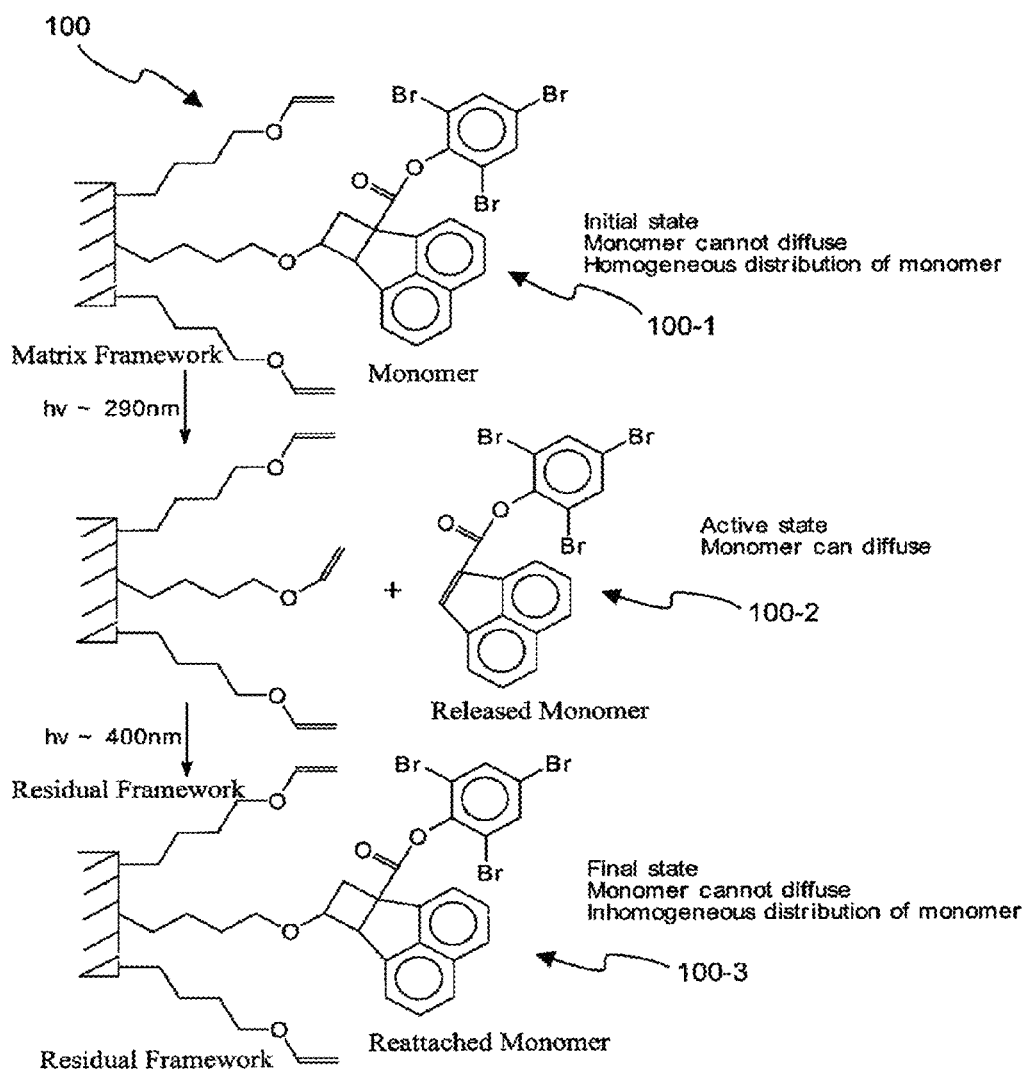
FIG. 1 is a schematic illustration of one approach or embodiment according to the present invention showing a reversible photocycloaddition reaction for a vinyl ether-containing diffusion-controlling matrix framework/photoactive cyclobutaneacenaphthylene-containing monomer system wherein the photoactive acenaphthylene-containing monomer is reversibly released from the matrix framework.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "light source" refers to any source of electromagnetic radiation of any wavelength. The light source of the present invention may be from one or more lasers, one or more light emitting diodes (LEDs), etc. In some embodiments, the light source may have a wavelength of between about 200 nm and about 1000 nm.

For the purposes of the present invention, the term "photoinitiating recording light" refers to a light that activates a photoinitiator, a photoactive monomer, a phototerminator, or any combination thereof, to cause the photoactive monomer to form (write) one or more holographic gratings.

For the purposes of the present invention, the term "photo cleaving light" refers to a light which causes photo cleavage of a photoinitiator, a photoactive monomer, a phototerminator, or any combination thereof from a diffusion-controlling matrix framework.

For the purposes of the present invention, the term "photo-polymerizing light" refers to a light which causes photoinitiated immobilization of a photoinitiator, a photoactive monomer, a phototerminator, or any combination thereof either by polymerization or by attachment to a diffusion-controlling matrix framework.

For the purposes of the present invention, the term "spatial light intensity" refers to a light intensity distribution or pattern of varying light intensity within a given volume of space.

For the purposes of the present invention, the terms "holographic grating," "holograph" or "hologram" (collectively and interchangeably referred to hereafter as "hologram") are used in the conventional sense of referring to an interference pattern formed when a signal beam and a reference beam interfere with each other. In cases wherein data is recorded page-wise, the signal beam may be encoded with a data modulator, e.g., a spatial light modulator, to provide a data beam.

For the purposes of the present invention, the term "holographic recording" refers to a hologram after it is recorded in the holographic medium. The holographic recording may provide bit-wise storage (i.e., recording of one bit of data), may provide storage of a 1-dimensional linear array of data (i.e., a 1×N array, where N is the number linear data bits), or may provide 2-dimensional storage of a page of data. Holographic recording may be performed in a holographic storage medium with photoinitiating recording light.

For the purposes of the present invention, the term "holographic storage medium" refers to a component, material, etc., that is capable of recording and storing, in three dimensions (i.e., the X, Y and Z dimensions), one or more holograms (e.g., bit-wise, linear array-wise or page-wise) as one or more patterns of varying refractive index imprinted into the medium. The holographic storage medium (which may also be referred to interchangeably as a "holographic recording medium" or a "photoimageable system") at least comprises at least one photoactive monomer, preferably photoactive index-contrasting monomer, which is attached to a diffusion-controlling matrix framework, and optionally a polymer support matrix (if the diffusion-controlling matrix framework does not also function as the polymer support matrix).

For the purposes of the present invention, the terms "dynamic range" or "M#" relate to an intrinsic property of a holographic medium and refer to the total response of that medium when portioned among the one or more holograms recorded in a common volume and related to the index change and thickness of that medium. See Shelby, "Media Requirements for Digital Holographic Data Storage," *Holographic Data Storage*, Section 1.3 (Coufal, Psaltis, Sincerbox Eds. 2003).

For the purposes of the present invention, the term "diffraction efficiency" of a recorded hologram refers to the fraction of light refracted into a reconstructed object or reference beam by the recorded hologram when illuminated with a beam of light at the same or similar position, angle, wavelength, etc., to the object or reference beam used to record that hologram.

For the purposes of the present invention, the term "percentage of dynamic range used" refers to how much of the dynamic range of a holographic medium has been used, relative to the total dynamic range capacity of the medium. For example, assuming all multiplexed holograms overlapping in a given volume have an equal diffraction efficiency, M# and the diffraction efficiency (DE) may be related by the following equation: $DE=(M\#/n)^2$, wherein n is the number of holograms multiplexed in that volume.

For the purposes of the present invention, the term "holographic data" refers to data stored in the holographic medium as one or more holograms.

For the purposes of the present invention, the term "data page" or "page" refers to the conventional meaning of data page as used with respect to holography. For example, a data page may be a page of data, one or more pictures, etc., to be recorded or recorded in a holographic medium. Data may also include images (e.g., display holograms).

For the purposes of the present invention, the term "recording light" refers to a light source used to record information, data, etc., into a holographic medium.

For the purposes of the present invention, the term "recording data" refers to writing or storing holographic data in a holographic medium.

For the purposes of the present invention, the term "reading data" refers to retrieving, recovering, or reconstructing holographic data stored in a holographic medium.

For the purposes of the present invention, the term "substrate" refers to components, materials, etc., such as, for example, glass plates or plastic plates, which are associated with the holographic medium, and which may provide a supporting structure for the holographic medium. Substrates may also optionally provide other beneficial properties for the article, e.g., rendering the holographic medium optically flat, providing a barrier to water vapor, providing a surface for antireflective coatings, etc.

For the purposes of the present invention, the term "polymer support matrix" refers to a polymeric material, medium, substance, etc., which provides an index contrast in recording and which also retains the recorded structures (archival stability). The polymer support matrix may be a thermoplastic or a thermoset material. The polymer support matrix may be formed separately and by different chemistries from the photoactive monomer used to record holograms (e.g., two-component systems), as described in commonly-assigned U.S. Pat. No 6,482,551 (Dhar et al.), issued Nov. 19, 2002, the entire disclosure and contents of which is hereby incorporated by reference. The polymer support matrix also contains substantially few to zero index-contrasting groups which are preferably contained in the photoactive monomer, thereby making the photoactive monomer a photoactive index-contrasting monomer. The polymer support matrix may be designed to allow the photoactive monomer to diffuse through and to be miscible with/dispersible within the polymer support matrix such that very little light scattering occurs (e.g., either before or after photopolymerization of the photoactive index-contrasting monomer). The polymer support matrix may also function as the diffusion-controlling matrix framework.

For the purposes of the present invention, the term "oligomer" refers to a polymer or polymerizable material (e.g., a photoactive index-contrasting monomer) having approximately 30 repeat units or less or any large molecule able to diffuse at least about 100 nm in approximately 2 minutes at room temperature when dissolved in a holographic medium of the present invention. When more than one polymerizable group is present on the oligomer, they may be the same or different. Additionally, oligomers may be dendritic. With reference to photopolymers, such oligomers may be the product or products of polymerization of monomers with about 30 or less repeating units, and may comprise residual unreacted functional groups and may be crosslinked. To avoid affecting archival stability of the photopolymer because of potential diffusion through or from the polymer support matrix, photopolymer oligomers may be mechanically or covalently bonded to the polymer support matrix.

For the purposes of the present invention, the term "photopolymerization" refers to any polymerization reaction caused by exposure to a photo-polymerizing light source.

For the purposes of the present invention, the term "free radical polymerization" refers to any polymerization reaction that is initiated by any molecule comprising a free radical or radicals.

For the purposes of the present invention, the term "cationic polymerization" refers to any polymerization reaction that is initiated by any molecule comprising a cationic moiety or moieties.

For the purposes of the present invention, the term "anionic polymerization" refers to any polymerization reaction that is initiated by any molecule comprising an anionic moiety or moieties.

For the purposes of the present invention, the term "polymerization" refers to any reaction that is initiated by photopolymerization, free radical polymerization, cationic polymerization, anionic polymerization or any combination of the above.

For the purposes of the present invention, the term "photoaddition reaction" refers to photoiniated addition reactions (catalyzed or uncatalyzed) wherein a bond is formed between two or more often smaller molecules to form a single often larger molecule. Photoaddition reactions may include photocycloaddition reactions, photoinduced reactions involving photoisomerization, lactonization, etc., or any combination thereof. The term "photoaddition reaction" may also refer to the forward reaction (i.e., forming a single, often larger, molecule from two or more often smaller molecules), the reverse reaction (reverse photoaddition) or a reversible reaction (i.e., may comprise both forward and reverse photoaddition reactions).

For the purposes of the present invention, the term "reverse photoaddition reaction" refers to photoiniated reactions (catalyzed or uncatalyzed) wherein one or more bonds in a single, often larger, molecule are broken, often to form two or more smaller molecules.

For the purposes of the present invention, the term "reversible photoaddition reaction" refers to photoiniated reactions (catalyzed or uncatalyzed) wherein a bond may be formed (or broken) between two molecules is broken, i.e., may undergo a forward photoaddition reaction and a reverse photoaddition reaction.

For the purposes of the present invention, the term "photocycloaddition reaction" refers to photoiniated pericyclic addition reactions in which two or more $\pi$ double bonds are lost and two or more $\sigma$ double bonds are gained such as, for example, photodiene formation/Diels Alder reactions, concerted and nonconcerted ene-ene reactions (2+2, 4+4, 4+2, 3+2, etc.), and may also include reverse photocycloaddition reactions and reversible photocycloaddition reactions. Monomers which may undergo photocycloaddition reactions may include, for example, monomers which comprise acenaphthylene moieties, phenanthrenes moieties, and related polyaromatic hydrocarbon moieties, including derivatives thereof, such as, for example, cycloalkylpolyaromatic hydrocarbon moieties. See commonly assigned U.S. Pat. Appln. No. 2004/0027625 (Trentler et al.), published Feb. 12, 2004; and U.S. Pat. Appln. No. 2007/0166625 (Cole et al.), published Jul. 19, 2007, the entire disclosures and contents of which is hereby incorporated by reference.

For the purposes of the present invention, the term "photoinitiator" refers to the conventional meaning of the term photoinitiator and also refers to sensitizers and dyes. In general, a photoinitiator causes the light initiated polymerization of a material, such as a photoactive monomer, when the photoinitiator is exposed to light of a wavelength that activates the photoinitiator, i.e., a photoinitiating light source. The photoinitiator may refer to a combination of components, some of which individually are not light sensitive, yet in combination are capable of initiating polymerization of a polymerizable material (e.g., a photoactive monomer), examples of which may include a dye/amine, a sensitizer/iodonium salt, a dye/borate salt, etc. The term photoinitiator may also refer to a single photoinitiator or to a combination of two or more photoinitiators. For example, two or more photoinitiators may be used to allow recording at two or more different wavelengths of light.

For the purposes of the present invention, the term "Compound A" refers to one or more compositions, compounds, components, materials, molecules, etc., capable of undergoing reversible termination reactions using a light source and/or heat.

For the purposes of the present invention, the term "photoactive monomer" refers to a photoactive index-contrasting monomer, a photoactive oligomer or combinations thereof which comprise at least one index-contrasting group, which are diffusible through the holographic storage medium when in an unwritten (unpolymerized) state, and which polymerize or become attached to a diffusion-controlling matrix framework when exposed to a photoinitiating light source, e.g., recording light, either in the presence or absence of a photoinitiator that has been activated by the photoinitiating light source. In reference to the reactive functional group that undergoes polymerization, the photoactive index-contrasting monomer comprises at least one such reactive functional group. It is also understood that there exist photoactive index-contrasting monomers which may also comprise photoinitiators, such as, for example, N-methylmaleimide, acrylate derivatized acetophenones, etc. In such a case, it is understood that the photoactive index-contrasting monomer may also be a photoinitiator or a phototerminator.

For the purposes of the present invention, the term "photopolymer" refers to a polymer formed or resulting from the polymerization of one or more photoactive monomers, and possibly one or more additional monomers and/or oligomers.

For the purposes of the present invention, the term "thermoplastic" refers to the conventional meaning of thermoplastic, i.e., a composition, compound, material, medium, substance, etc., that exhibits the property of a material, such as a high polymer, that softens when exposed to heat and generally returns to its original condition when cooled to room temperature. Examples of thermoplastics include, but are not limited to: poly(vinyl acetate), poly(styrene), poly(ethylene), poly(propylene), cyclic olefin polymers, poly(ethylene oxide), linear nylons, linear polyesters, linear polycarbonates, linear polyurethanes, etc.

For the purposes of the present invention, the term "room temperature" refers to the commonly accepted meaning of room temperature, i.e., an ambient temperature of 20°-25° C.

For the purposes of the present invention, the term "thermoset" refers to the conventional meaning of thermoset, i.e., a composition, compound, material, medium, substance, etc., that is crosslinked such that it does not have a melting temperature, and cannot be dissolved in a solvent, but which may be swelled by a solvent. Examples of thermoset materials may include crosslinked poly(urethanes), crosslinked poly(acrylates), crosslinked poly(styrene), etc.

For the purposes of the present invention, the term "X-Y plane" typically refers to the plane defined by the substrates or the holographic medium that encompasses the X and Y linear directions or dimensions. The X and Y linear directions or dimensions are typically referred to herein, respectively, as the dimensions known as length (i.e., the X-dimension) and width (i.e., the Y-dimension).

For the purposes of the present invention, the terms "Z-direction" and "Z-dimension" refer interchangeably to the linear dimension or direction perpendicular to the X-Y plane, and is typically referred to herein as the linear dimension known as thickness.

For the purposes of the present invention, the term "index" refers interchangeably to the index of refraction or refractive index.

For the purposes of the present invention, the term "refractive index contrast ($\Delta n$)" is as conventionally known, and is defined as the amplitude of the sinusoidal variations in the refractive index of a material in which a plane-wave, volume hologram has been written. The refractive index may vary as: $n(x)=n_0+\Delta n \cos(K_x)$, wherein $n(x)$ is the spatially varying refractive index, x is the position vector, K is the grating wave vector, and no is the baseline refractive index of the medium. See, e.g., P. Hariharan, Optical Holography: Principles, Techniques and Applications, Cambridge University Press, Cambridge, 1991, pg. 44, the entire disclosure and contents of which is hereby incorporated by reference. The Δn of a material may be calculated from the diffraction efficiency or efficiencies of a single volume hologram or a multiplexed set of volume holograms recorded in a medium.

For the purposes of the present invention, the term "index contrast" refers to the ability of a material to create spatially distinct volumes of higher or lower indices of refraction. For example, in a photoactive higher index-contrasting monomer polymerized in a lower index-contrasting polymer support matrix by using an interference pattern generated by crossed laser light, the pattern of the polymerized monomer mimics this interference pattern and thus creates volumes of material that have a higher refractive index (where light intensity is higher) and volumes of material that have a lower refractive index (where light intensity is lower or zero). Any refractive index contrast may allow one to control the direction that light travels by refraction or diffraction. In embodiments of the present invention, the average index contrast between the photoactive index-contrasting monomer and the polymer support matrix may be greater than about 0.1, for example, greater than about 0.2, more typically, greater than about 0.3. The average index contrast may be measured by direct measurement of the refractive index, molar refractive index calculations, solution refractive index methods, holographic measurement of Δn (most typically), etc., known to those skilled in the art.

For the purposes of the present invention, the term "index-contrasting group" refers to those parts of the photoactive index-contrasting monomer which may lend themselves to creating a refractive index contrast between the polymer support matrix of the holographic storage medium and the photoactive index-contrasting monomer after exposure to a photoinitiating light source to, for example, record holograms. This refractive index contrast may be created by having the index-contrasting groups provide either higher or lower (often higher) refractive index contrast between the photopolymer resulting from the photoactive index-contrasting monomer and the polymer support matrix. Index-contrasting groups having a higher refractive index may be comprised of polarizable atoms and groups of atoms. For example, suitable index-contrasting groups may include one or more of bromine, chlorine, sulfur, phosphorous, benzene rings, naphthalene rings, trityl groups, biphenyls, conjugated enes or ketones, etc. For embodiments of the present invention, the index-contrasting group may often refer to the collection of index-contrasting groups that provide the majority of the index contrast for the photoactive index-contrasting monomer. For example, a brominated benzene ring attached to a benzophenone moiety may be attached to a linker moiety and then to an acrylate moiety would contain one index-contrasting group comprising both the brominated benzene and the benzophenone group. In certain embodiments, the geometry for the index-contrasting group is such that the individual components comprising the index-contrasting group are centrally located with linking moieties or reactive groups extending away from the index-contrasting group.

For the purposes of the present invention, the term "average radius of the index-contrasting group" refers to the average radius of the Van der Waals radii of all of the collective index-contrasting groups. Such radii may be obtained by any conventional molecular modeling program.

For the purposes of the present invention, the term "average diameter of the index-contrasting group" refers to the average diameter of the Van der Waals diameter of all of the collective index-contrasting groups. Such diameters may be obtained by any conventional molecular modeling program.

For the purposes of the present invention, the term "diffusion-controlling matrix framework" refers to a matrix framework to which an active component (e.g., a photoactive index-contrasting monomer) may be temporarily attached to, and optionally may be reversibly reattached to, to provide gated or controlled diffusion of the active component through the holographic storage medium. While attached to the diffusion-controlling matrix framework the active component is rendered incapable of diffusing significantly away from the attachment point. These diffusion-controlling matrix frameworks may comprise polymers having one or more pendant functional groups (e.g., amino, hydroxy, keto, carbonyl, carboxy, vinyl, imine, epoxy, isocyanate, sulfhydryl, acyl chloride, etc.) for attachment of the photoactive index-contrasting monomer, for example, thermoset polyurethanes having one or more functional isocyanate groups, polymer matrices having one or more functional vinyl groups, and further matricies as described in Trentler, et al.; Cole, et al.; and matricies as described in Dhar, et al. modified with pendant functionality as described above.

Figure 2:
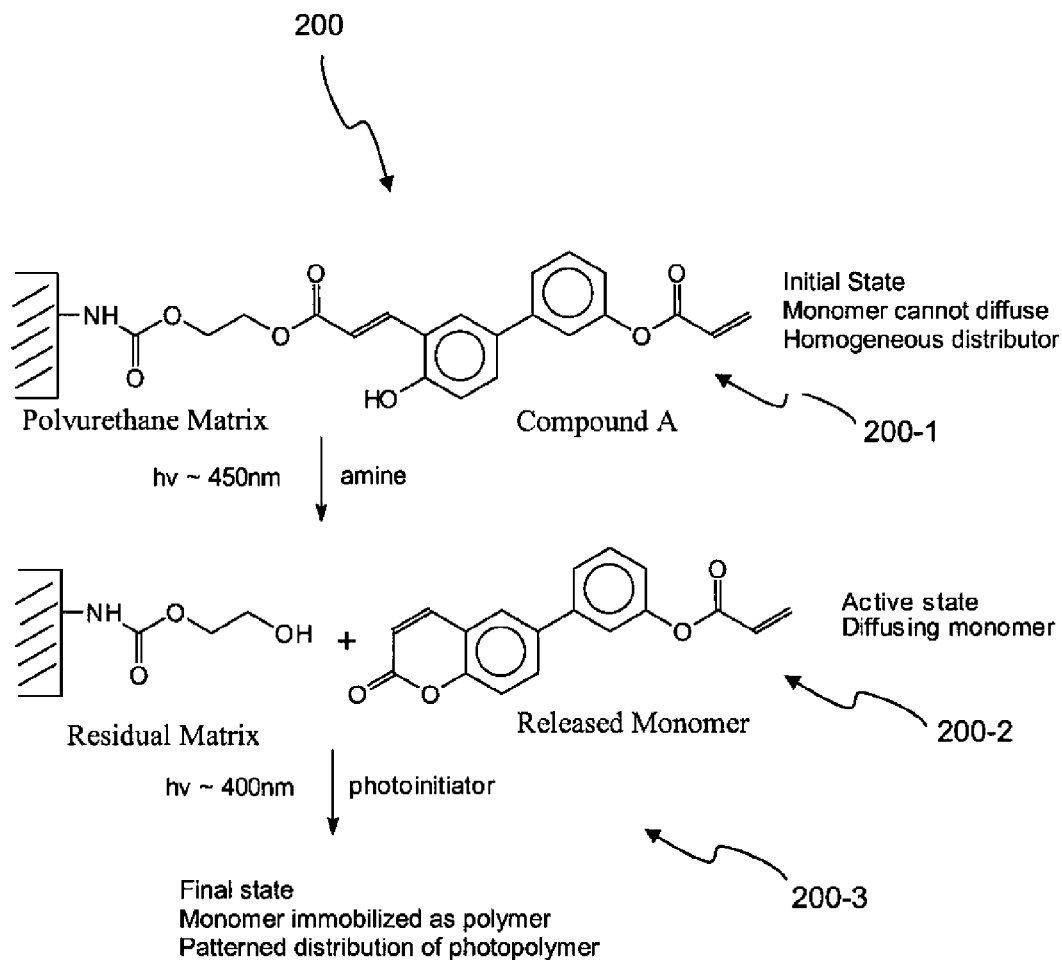
FIG. 2 is a schematic illustration of another approach or embodiment according to the present invention involving a photoactive index-contrasting monomer which undergoes a reverse photoaddition reaction to release the photoactive monomer from a polyurethane thermoset matrix framework.

For the purposes of the present invention, the term "photo-cleavage" refers to exposing a photoactive index-contrasting monomer attached to a diffusion-controlling matrix framework to photo-cleaving light in a manner which causes release (cleavage or detachment) of the photoactive index-contrasting monomer from the diffusion-controlling matrix framework to allow diffusion of the photoactive monomer to begin. Photo-cleavage may be carried out by utilizing a light source in the 290 nm range in one embodiment and 450 nm in another embodiment. Examples of photo-cleavage are illustrated in FIGS. 1 and 2. Effective wavelengths for photo-cleavage may be adjusted by judicious choice of chromophore in the photocleavable group.

For the purposes of the present invention, the term "reactive functional group" refers to a functional group responsible for polymerization of the photoactive index-contrasting monomer. For example, suitable reactive functional groups may include the following: ethylenic unsaturation (i.e., one or more double bonds, such as acrylates, methacrylates, acrylamides, methacrylamides, styrenes, substituted styrenes such as methyl styrene, etc., vinyl naphthalenes, substituted vinyl naphthalenes, other vinyl polyaromatics, vinylcyclohexene, vinylcyclohexene dioxide, vinylcyclohexene monoxide, vinyl esters, vinyl ethers, vinyl carbazoles, other vinyl derivatives, cycloalkenes, cyclic ethers (e.g., epoxide, glycidyl ether, allyl glycidyl ether, etc.), cyclic carbonates, cyclic esters, dioxalanes, etc.

For the purposes of the present invention, the term "primary reactive group" refers to a primary group, as distinct from secondary or tertiary group, as this term is conventionally used in chemistry. For example, butyl acrylate is a primary acrylate, and butyl methacrylate is a primary methacrylate, but butyl methacrylate is a secondary alkene, while butyl acrylate may be referred to as a primary alkene.

For the purposes of the present invention, the term "reactive site" refers to a functional group on the photoactive index-contrasting monomer that causes radical generation either by chain transfer or by cleavage due to photoinitiating recording light (i.e., basically a photoinitiator attached to the photoactive index-contrasting monomer or a photoactive index-contrasting monomer that has photoinitiating functionality). The reactive site may also be a chain transfer site for anionic or cationic reactions as well.

For the purposes of the present invention, the term "chain length" refers to the kinetic chain length, or the average degree of polymerization.

For the purposes of the present invention, the term "reactive particles" refers to nanoparticles, metal clusters, dendrimers, etc., of at least about 1 nm in size, and which may be in the range of from about 1 to about 200 nm in size, with photopolymerizable reactive groups being termed the reactive particles, thus performing as photoactive polymerizable materials in their ability to photopolymerize.

For the purposes of the present invention, the term "pseudo-step growth" refers to polymerizable materials that inherently increase in molecular weight in a step growth pattern or manner, yet use chain addition reactions (for example, radical, cationic, or anionic chain growth polymerizations). For example, thiol-acrylate polymerizations containing an excess of acrylate are a pseudo-step growth polymerization because the chains growing by both step growth and chain growth mechanisms.

For the purposes of the present invention, the term "rotaxane-like structure" refers to a mechanically-interlocked molecular architecture consisting of a dumbbell-shaped molecule that is threaded through a macrocycle or ring-like molecule. Rotaxanes may contain two or more molecular components mechanically interlocked with one another. One component is typically a dumbbell-shaped or backbone component having one or more binding sites. The remaining component(s) are circular or ring-shaped component(s) that become trapped on the dumbbell component, encircling part of that component. The two components kinetically trapped as the two end-groups of the dumbbell (often called stoppers) are larger than the internal diameter of the ring, and thus prevent dissociation (unthreading) since this would require significant distortion of the covalent bonds. A particular ring makes mechanical contact with, but is typically not chemically bonded to, the backbone. Depending on how the ring component is fabricated, the component may have one or more minimum-energy locations along the backbone. Other examples of rotaxane-like structures may include pseudo-rotaxanes, catenanes, etc.

For the purposes of the present invention, the term "catenane-like structure" refers to a mechanically-interlocked molecular architecture comprising two or more interlocked macrocyclic rings. The interlocked rings cannot be separated without breaking the covalent bonds of the macrocycles. Catenanes are conceptually related to other mechanically-interlocked molecular architectures, such as rotaxanes, molecular knots, molecular Borromean rings, etc. The term "mechanical bond" has also been coined to describe the connection between the macrocyclic rings of a catenane.

For the purposes of the present invention, the term "interpenetrating network" has the usual and conventional meaning in that two different polymers are interconnected, interwoven, wound around and through one another, etc.

For the purposes of the present invention, the term "Kramers-Kronig relationship" refers to mathematical properties which connect the real and imaginary parts of any complex function analytic in the upper half plane. For embodiments of the present invention, the Kramers-Kronig relation may be used to describe the increase in refractive index as an absorption band is approached.

For the purposes of the present invention, the term "archival life" refers to the time (e.g., in years) that the holographic medium can retain at least about 90% of the original diffraction efficiency of the recorded hologram(s).

For the purposes of the present invention, the term "archival stability" refers to the ability of a holographic storage medium to retain holographic data in the presence of heat, humidity, time, other variables, etc. It is understood that substrates and other components of embodiments of optical articles of the present invention may contribute to increased archival stability of the holographic medium. Increased archival stability may also lead to increased archival life.

For the purposes of the present invention, the term "shelf life" refers to the time (e.g., in months or years) that the holographic medium (or optical article comprising same) may sit in storage before recording holograms, yet retain at least about 90% of the original dynamic range. Shelf lives of greater than about 6 months, for example, greater than about one year, more typically greater than about 2 years, may be obtained with embodiments of media/articles of the present invention.

For the purposes of the present invention, the term "linking moiety" refers to at least one atom (e.g., more than 2 atoms) forming a linear chain connecting two specified and different parts of a molecule. The specified and different parts connected may comprise the index-contrasting group and the reactive (functional) group. For example, a linker moiety may be one or more atoms forming a linear chain of atoms between an index-contrasting group and a reactive group on a molecule of a photoactive index-contrasting monomer. Also, there may be more than one linker moiety (e.g., potentially of a different chemical composition and length).

For the purposes of the present invention, the term "partially hindered reactive group" refers to reactive (functional) groups that have some degree of steric hindrance either directly adjacent to the reactive group(s) or in close enough proximity to the reactive group(s) to reduce the reactivity of the reactive group(s) (e.g., ability to polymerize, etc.).

For the purposes of the present invention, the term "sensitivity" refers to the energy required to generate a measured amount of index contrast.

For the purposes of the present invention, the term "covalently crosslinked" refers to the conventional meaning and use of this term, wherein one or more linear polymer chains are covalently bonded to other linear polymer chains to form a 3-dimensional network.

For the purposes of the present invention, the term "shrinkage" refers to a decrease in volume that normally accompanies the transition from polymerizable material to polymer. Not all polymerizable materials produce shrinkage. For many embodiments, shrinkage may be less than about 5 volume %, for example, less than about 1 volume %, and more typically between 0 and about 0.1 volume %. Conversely, expansion may also occur in some embodiments (e.g., as may happen with some ring opening polymerizations).

For the purposes of the present invention, the term "chain transfer" refers to interrupting the growth of a kinetic chain by formation of a new radical that may react as a new nucleus for forming a new polymeric molecular chain. Chain transfer may cause the formation of a higher proportion of shorter polymer chains, relative to polymerization reactions that occur without chain transfer. Chain transfer may also occur with cationic and anionic polymerizations.

For the purposes of the present invention, the term "reactive particle" refers to polymerizable materials which may be described as nanoparticles, dendrimers, hyperbranched polymers, metal clusters, oligomers, other molecular associations with reactive groups, etc., whereby the size of the particle is larger than about 1 nm in at least one dimension. Such reactive particles have, on average, at least one reactive group per particle, for example, reactive particles having on average at least 3 reactive groups, and more typically reactive particles having on average from 5 to 10 reactive groups. Generally, larger particles have more reactive groups. Some particles may be dynamic in nature in that the constituent parts may be in equilibrium with the particle (e.g., for some metal clusters), but other particles may be static, i.e., having a well defined and stable form.

For the purposes of the present invention, the term "nanoparticle" refers to organic or inorganic particles having a size in the range of from about 1 to about 200 nm in at least one dimension (and often in three spatial dimensions).

For the purposes of the present invention, the term "dendrimer" refers to fully synthetic macromolecules comprised of perfectly branched repeat units in layers emanating radially from a point-like core. "Dendridic" refers to molecules having structures resembling dendrimers, but which may be less perfectly structured, for example, hyperbranched star polymers.

For the purposes of the present invention, the term "optical article" refers to an article comprising a holographic medium and other optional structures, components, elements, materials, etc., such as, for example, substrates, antireflective and/or scratch resistant coatings, labeling, cartridges, hubs, etc. Examples of optical articles may include recording media, waveguides, beam or optical filters, beam steerers or deflectors, optical couplers, etc.

For the purposes of the present invention, the term "bulk diffusion" refers to the diffusion of photoactive monomers within the holographic storage medium. In an embodiment of the invention, the diffusion of the photoactive monomers would be uniform throughout the holographic storage medium prior to a write operation on the holographic storage medium.

For the purposes of the present invention, the term "gated diffusion" refers to a photonically-controlled switching on or off of the ability of the photoactive index-contrasting monomer to diffuse through the holographic storage medium.

For the purposes of the present invention, the term "photonically-controlled" refers to controlling the ability of the photoactive index-contrasting monomer to diffuse through the holographic storage medium by selectively applying photo cleaving light and photo-polymerizing light to the holographic storage medium.

For the purposes of the present invention, the term "active writing component" refers to those components which are actively involved in formation (writing) of holograms and holographic data. These active components may include index-contrasting (writing) monomer(s), photoinitiator(s), phototerminator(s), etc.

Description

Previously, photopolymer-based holographic data storage media employed photoactive polymerizable index-contrasting monomers which were freely diffusing in the initial unwritten (unpolymerized) state. Media of this type may need to be fully photopolymerized within an appropriate time frame after initial recording (writing) in order that the diffusion of the unreacted photoactive index-contrasting monomer present in adjacent unexposed regions cannot occur to a significant extent into previously exposed regions of the media. If this diffusion is allowed to happen, deleterious effects on both the recorded (written) structures and future performance of unrecorded (unwritten) areas are observed.

Photoactive index-contrasting monomer diffusion over distances on the order of the periodicity of the written structure may be essential for both development and permanence of the holographic data structure. Bulk diffusion of photoactive index-contrasting monomer into the recorded (written) area of the medium from outside the recorded (written) area may be problematic. Accordingly, practical embodiments of articles and methods to allow photoactive index-contrasting monomer to diffuse when necessary in a controlled volume at a controlled time but otherwise be incapable of diffusion outside of this controlled volume or time is described herein.

Preventing, inhibiting, minimizing, reducing, etc., bulk diffusion of active hologram-forming (writing) components (e.g., index-contrasting (writing) monomer(s), photoinitiator(s), phototerminator(s), etc.) from unilluminated portions of the photopolymer-based photoactive media (e.g., holographic data storage media, holographic optical element media, media for optical waveguides, etc.) into volumes of the media which have been exposed to light may be desirable. Reasons why this bulk diffusion may be undesirable include negative impacts on the stability of the holographic data structures recorded (written) in the illuminated areas, regions, portions, zones, etc., of the holographic storage media, changes in performance characteristics of these unilluminated areas, regions, portions, zones, etc., which make future use of these unilluminated areas, regions, portions, zones, etc., for holographic data storage more difficult.

One method for preventing, inhibiting, minimizing, reducing, etc., bulk diffusion of these active writing components is to attach some or all of these active components to a matrix framework (e.g., a thermoset polymer) which thus provides a rigid or semi-rigid framework within the holographic storage medium. If the function of an active writing component is not adversely affected by its inability to diffuse through the holographic storage medium, then this component may be permanently attached to the diffusion-controlling matrix framework. In the case of holographic data storage media comprising a photopolymer, the active writing components may include photoactive index-contrasting monomers, photoinitiators, phototerminators, etc.

However, if the function of the active writing component requires that this component be capable of diffusion through the holographic storage medium, then permanent attachment of these components to the diffusion-controlling matrix framework may not be feasible. The photoactive index-contrasting (writing) monomer is an example of such an active writing component because diffusion of the photoactive index-contrasting monomer through the holographic storage medium over the scale of the period of the structure being recorded (written) is necessary for both development and permanence of the recorded (written) holograms and holographic data. Therefore, if limiting bulk diffusion of such an active writing component through the holographic storage medium employs attachment to a diffusion-controlling matrix framework, the attachment method needs to incorporate a mechanism for cleavage so that the active component may be released to diffuse within a controlled region of the medium and at a controlled time.

In embodiments of the holographic storage medium, the photoactive index-contrasting (writing) monomer is able to diffuse through the medium at all times prior to light induced or initiated photopolymerization. This diffusion, while necessary and beneficial over a distance scale of the order of the periodicity of the structure being recorded (written), may become detrimental when this diffusion occurs to a significant degree from an unexposed volume (e.g., area, portion, zone, region, etc., unexposed to photoinitiating recording light) of the holographic storage medium into an exposed volume (e.g., area, portion, zone, region, etc., exposed to photoinitiating recording light) of the medium. These detrimental effects may include decay in material performance properties in the unexposed volume of the holographic storage medium, as well as a distortion of the holographic structures recorded (written) in the exposed volume of the medium.

An example of the adverse effect of diffusion from unexposed volumes of the holographic storage medium on recorded (written) holographic structures is the decrease in diffraction efficiency of ~1 mm$^2$ planewave holograms which is observed on aging in media which is not fully photocured (i.e., illuminatively cured with light to minimize, remove, reduce, diminish, etc., the residual sensitivity from all of the dynamic range of the medium to subsequent exposure to a photoinitiating light source). This diffraction efficiency may decrease as the result of diffusion from unexposed regions of the holographic storage medium due to the observation that diffraction efficiency remains stable over time if, after recording (writing) of the holographic gratings, the entire holographic storage medium is exposed to sufficient photoinitiating light to polymerize all of the photoactive index-contrasting monomer, thereby shutting down index-contrasting monomer diffusion.

The timescale over which these effects exhibit themselves may be expected to depend on the overall size of the written volume with the timescale increasing as the square of the relevant distance. Therefore, the same fundamental process which might limit to several years the long-term archival lifetimes of partially recorded (written) holographic storage media employing ~1 mm$^2$ spot sizes (as may be typical of page-wise holographic data recording techniques) may cause destruction of data within minutes in ~1 um$^2$ spot sizes (as may be common for bit-wise holographic data recording techniques).

Embodiments of the techniques and methods of the present invention by which active writing components (which need to diffuse through the holographic storage medium to function) may be produced or provided in an initial state in which they cannot diffuse, but which may then be transformed into an active state where diffusion is possible in selected volumes of the holographic storage medium and at selected times using external stimuli (e.g., photo-cleaving light of, for example, a controlled wavelength) and then, after recording (writing) the desired holographic structures, be subsequently fixed in a final state within this exposed volume in such a way that further diffusion though the holographic storage medium is again substantially prevented, inhibited, minimized, reduced, etc.

There are at least two different approaches or embodiments for achieving this type of photonically-controlled gated diffusion of index-contrasting (writing) monomers. The first embodiment employs systems described in the context of rewritable holographic data storage media. The second embodiment uses systems closely related to WORM media but using modified photoactive index-contrasting monomers which are covalently attached to a diffusion-controlling matrix framework using a tether which may be cleaved using light of a wavelength which does not necessarily induce photopolymerization.

The first approach or embodiment takes advantage of reversible photocycloaddition reactions characterized by photostationary states which, depending upon the irradiation wavelength, may be made substantially cyclized or substantially uncyclized. An example of this first embodiment/approach involving a vinyl ether-containing diffusion-controlling matrix framework/photoactive index-contrasting cyclobutaneacenaphthylene-containing monomer system is illustrated schematically in FIG. 1, and is indicated generally as 100. As also shown in FIG. 1, the primary index-contrasting moiety of the cyclobutaneacenaphthylene-containing monomer is the 2,4,6-tribromophenoxy moiety which is attached to the cyclobutaneacenaphthylene moiety via an ester bond.

As shown in FIG. 1, in the initial state of scheme 100 (see step 100-1), the photoactive index-contrasting monomer is covalently bound to the diffusion-controlling matrix framework and is distributed homogeneously throughout the holographic storage medium. As shown in FIG. 1, a significant excess of dangling vinyl ether groups may also be evenly distributed as part of the diffusion-controlling matrix framework. Irradiation with short wavelength photoinitiating cleaving light (~290 nm) results in cleavage of the cyclobutane portion of the acenaphthylene moiety, thereby generating a residual diffusion-controlling matrix framework having an attached new vinyl ether moiety, and a released freely diffusing photoactive index-contrasting acenaphthylene-containing moiety (see step 100-2). This state is thus active for recording, writing, forming, etc., holographic structures. In an embodiment of the invention, photo-cleaving light would have a wavelength between 260 nm and 320 nm. In another embodiment of the invention, photo-cleaving light would have a wavelength between 290 nm and 310 nm. It should be appreciated that it is critical to design the system to allow for the exclusion of wavelengths associated with a write operation in an optical media at this stage.

Once this active state has been achieved, irradiation with longer wavelength photo-polymerizing light (~400 nm) causes a 2+2 cycloaddition resulting in reattachment of the acenaphthylene-containing moiety of the monomer to the residual diffusion-controlling matrix framework (see step 100-3). The spatial distribution of the reattached acenaphthylene-containing moiety (i.e., as the cyclobutaneacenaphthylene-containing moiety) will now reflect the intensity pattern of the irradiating light and in general may not be homogeneous. At the end of the ~400 nm irradiation period, substantially all of the acenaphthylene-containing moieties may have reacted with, and reattached to, the residual diffusion-controlling matrix frameworks, and thus further diffusion of monomer comprising the acenaphthylene-containing moieties is no longer possible. In an embodiment of the invention, photo-polymerizing light would have a wavelength between 370 nm and 450 nm. In another embodiment of the invention, photo-polymerizing light would have a wavelength between 395 nm and 415 nm. It should be appreciated that it is critical to design the system to allow for the exclusion of wavelengths associated with an erase operation in an optical media at this stage.

The second approach/embodiment also begins with an initial state in which the index-contrasting (writing) monomer is covalently attached to a diffusion-controlling matrix framework and may be homogeneously distributed through the holographic storage medium. This index-contrasting (writing) monomer may contain the same functionalities as described for WORM type photopolymer media (e.g., a polymerizable group such as an acrylate or epoxide, groups to supply index contrast, etc.). This photoactive index-contrasting monomer differs from those previously disclosed in that it contains a new functional group which tethers the photoactive index-contrasting monomer to the diffusion-controlling matrix framework. This tethering group is designed such that it may be cleaved by an external stimulus (e.g., light of a controlled wavelength) in a specified volume of the holographic storage medium at a specified time. The cleavage process may occur either separately or concomitantly with other processes (such as photopolymerization) depending upon the particular conditions, index-contrasting monomer, diffusion-controlling matrix framework, etc., involved.

An example in which this second approach/embodiment is used involving a photoactive index-contrasting monomer which undergoes only a reverse photoaddition reaction to release the photoactive monomer is illustrated schematically in FIG. 2, and is indicated generally as 200. As shown in FIG. 2, in the initial state of scheme 200 (see step 200-1), the photoactive index-contrasting monomer attached to a diffusion-controlling matrix framework is created, for example, by formulating, in a polyurethane thermoset matrix, an attached photoactive index-contrasting (writing) monomer, using compound A as the photoactive index-contrasting monomer component.

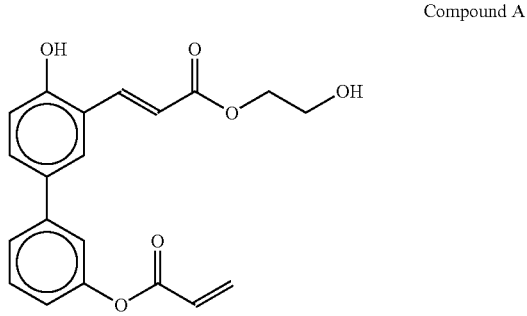

Compound A

The high relative reactivity of the primary aliphatic alcohol group of compound A towards the isocyanate group (as compared with the phenolic hydroxyl group of compound A) allows selective incorporation into the polyurethane thermoset matrix, as shown in FIG. 2. Irradiation with a photo cleaving light at ~450 nm (in the presence of an amine) induces photoisomerization of the trans-cinnamate moiety of compound A to a cis-cinnamate moiety. Lactonization then releases the photoactive index-contrasting monomer from the residual matrix to create the active state (see step 200-2). It is also possible to conduct this cleavage process without inducing photopolymerization. In an embodiment of the invention, photo cleaving light would have a wavelength between 425 nm and 500 nm. In another embodiment of the invention, photo-cleaving light would have a wavelength between 435 nm and 450 nm. It should be appreciated that in some embodiments it may be critical to design the system to allow for the exclusion of wavelengths associated with a write operation in an optical media at this stage.

Subsequent irradiation with photo-polymerizing light at ~400 nm causes photopolymerization of the released photoactive index-contrasting monomer in the same manner as for WORM media. This system may function using planewave holographic techniques. In an embodiment of the invention, photo-polymerizing light would have a wavelength between 300 nm and 425 nm. In another embodiment of the invention, photo-polymerizing light would have a wavelength between 400 nm and 410 nm.

The number of potential choices for photocleavable linking group are large and may be drawn, for example, from the considerable body of work reported on photolabile protecting groups (sometimes referred to a caging groups). (For examples see C. G. Bochet, J. Chem. Soc., Perkin Trans. 1, 2002, 125-142; G. Mayer, A. Heckel, Angew. Chem. Int. Ed. 2006, 45, 4900-4921; A. P. Pelliccioli, J. Wirz, Photochem. Photobiol. Sci. 2002, 1,441-458; M. Goeldner, R. Givens, Dynamis Studies in Biology, Wiley-VCH Weinheim, 2005; H. Morrison, Bioorganic Photochemistry, Vol 2, Wiley, N.Y., 1993; S. R. Adams, R. Y. Tsien, Annu. Rev. Physiol. 1993, 55, 755-784. The entire contents of the above references are hereby incorporated by reference.) Derivatives of these compounds which would allow for attachment of monomer and matrix on opposite sides of the cleavage site would then constitute a photocleavable linking group. The cleavage wavelength which is most effective will be determined by the detailed choice of cleavable group and so this invention should not be construed to be constrained to a particular narrow wavelength range since examples operating throughout the UV and visible wavelengths are known. But, it should be appreciated that for use in holographic storage, the selection of specific wavelengths are critical to the functionality of the device as discussed above. Derivatives of photolabile groups optimized for multiphoton-induced photolysis (for example see O. D. Fedoryak, T. M. Doreetters 2002, 4(20) 3419-3422; W. Denk, et al. Science 1990, 248, 73-76; Furuta, T., et al. Proc Natl. Acad. Sci. U.S.A. 1999, 96, 1193-2000. The entire contents of the above references are hereby incorporated by reference.) can move the cleavage wavelengths into the infrared and provide for further spatial resolution.

In some embodiments of this invention it is desirable to induce cleavage of the monomer from the diffusion-controlling matrix framework without triggering other photochemistry, such as photoinitiation of a polymerization reaction. An effective means of achieving this is to use a cleavable group which absorbs light strongly at wavelengths where the polymerization photoinitiator has little or no absorbance. Wavelengths longer than the low energy absorbance tail of the photoinitiator are ideal.

Another desirable feature of some embodiments is that after complete cleavage of the monomer from the diffusion-controlling matrix framework, there remain little or no absorbance due to the cleaved groups in the wavelength range associated with the subsequent photochemical step, such as photoinitiation of a polymerization reaction, or at wavelengths where high transmittance of the final article is desired, such as at the readout wavelengths in a holographic storage medium.

Figure 4:
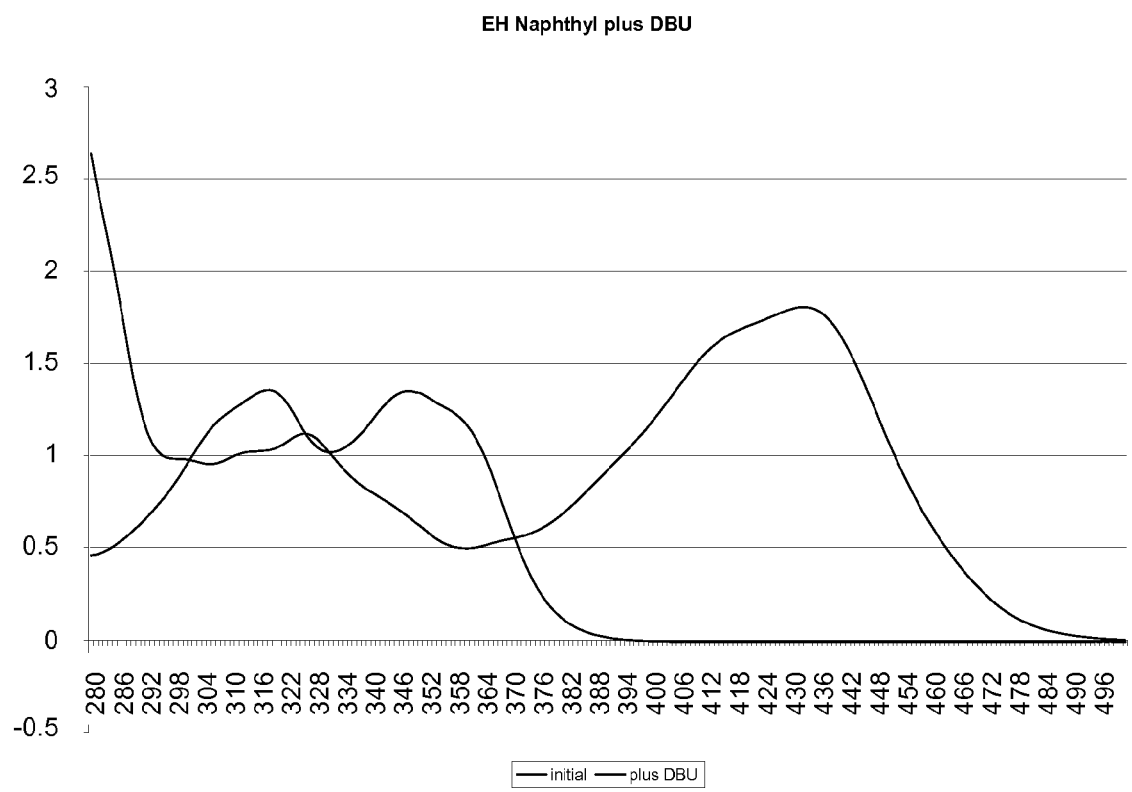
FIG. 4 compares the UV-Visible spectrum of Ethyl 2-hydroxybenzocinnamate with and without added DBU.

Incorporating both of these desirable features into a single photocleavable group is challenging. Hydroxycinnamate derivatives, used in conjunction with basic additives such as amines, can achieve this performance. As shown in FIG. 4 the absorbance spectrum of the cinnamate ester is shifted strongly to longer wavelengths when treated with the strong nitrogen base DBU. This spectral red-shift is due to formation of the phenoxide ion as the base deprotonates the phenolic hydroxyl group. The extent of the red shift is affected by both the basicity and concentration of the amine with higher concentrations and stronger bases inducing greater shifts.

Figure 5:
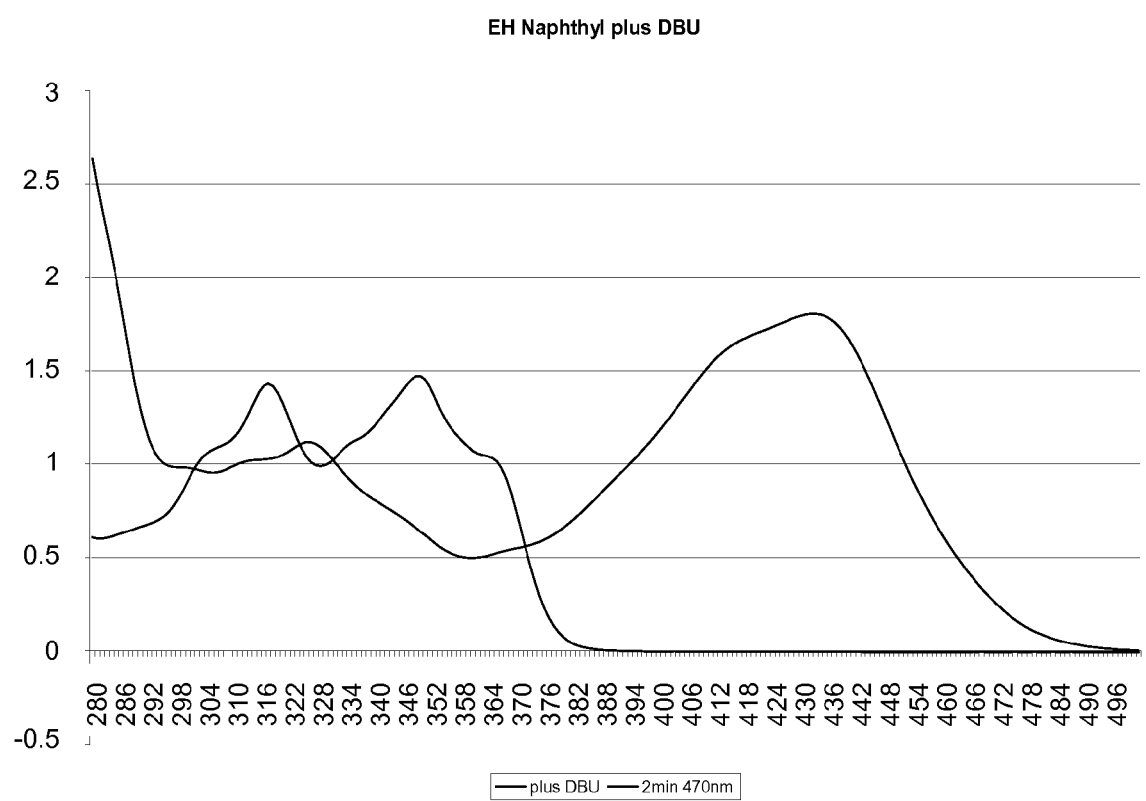
FIG. 5 compares the UV-Visible spectrum of Ethyl 2-hydroxybenzocinnamate with DBU to that of its lactonized photoproduct.

During the photocleavage process the phenolic hydroxyl group is esterified. The resulting lactone chromaphore no longer contains an acidic site and so is no longer red-shifted by bases. The large blue shift upon lactonization is shown in FIG. 5. The exceptionally large bleaching window this provides allows good separation between photocleavage and writing wavelengths thereby ensuring excellent orthogonality between the photocleavage and photopolymerization steps.

Alternatively, cleavage (from the diffusion-controlling matrix framework) of the photoactive index-contrasting monomer and initiation of photopolymerization may be achieved simultaneously by irradiation of the initial state with light which both the hydroxycinnamate moiety and photoinitiator absorb (~400 nm). The ratio of cleavage to photoinitiation may be controlled by manipulation of the spectrum of the hydroxycinnamate moiety using its base dependence to fine tune. Fixing into a final state wherein index-contrasting monomer diffusion is substantially stopped may occur by consumption of the released monomer through polymerization into species too large to diffuse (see step 200-3).

A. Storage Medium, Articles and Recording Holograms

Figure 3:
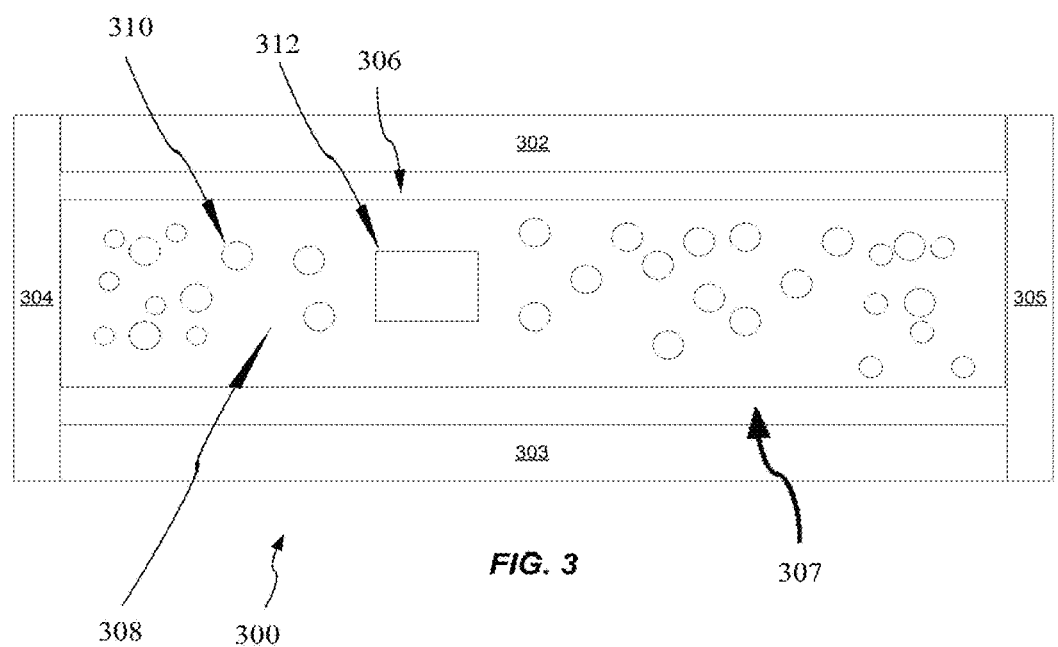
FIG. 3 is the article constructed from the embodiments described above.

Embodiments of the holographic storage media of the present invention may be formed such that holographic recording (writing) to and reading from the medium are possible. Turning now to FIG. 3, fabrication of holographic storage medium 300 may involve depositing a combination, blend, mixture, etc., of the polymer support matrix or diffusion-controlling matrix framework 308, polymerized photoactive index-contrasting monomer 310, photoinitiator, etc., on a support structure, such as a substrate 302, or may be positioned between a pair of (i.e., two) substrates 302/303, and using, for example, a gasket(s) 304/305 to contain the mixture. Spacers 306/307 may also be used between substrates 302/303 to maintain a desired thickness for the recording medium. A written hologram 312 is illustrated in support matrix 308. It should be appreciated that FIG. 3 is not drawn to scale and that the distribution of photoactive index-contrasting monomer 310 is only provided for illustrative purposes. The polymerization of photoactive index-contrasting monomer 310 prevents further diffusion of photoactive index-contrasting monomer 310 into hologram 312.

In applications requiring optical flatness, the liquid mixture may shrink during cooling (if a thermoplastic) or curing (if a thermoset) and thus distort the optical flatness of the article. To reduce such effects, it may be useful to place the holographic storage medium between substrates in an apparatus containing mounts, e.g., vacuum chucks, capable of being adjusted in response to changes in parallelism and/or spacing. In such an apparatus, it may be possible to monitor the parallelism in real-time by use of conventional interferometric methods, and to make any necessary adjustments to the heating/cooling process. During formation, the holographic storage medium may be supported in other ways other than by use of a substrate or substrates. More conventional polymer processing is also envisioned, e.g., closed mold formation, sheet extrusion, etc. A stratified article is also contemplated, i.e., a plurality of holographic storage medium layers disposed between respective substrates.

Embodiments of the holographic storage media of the present invention that are formed may be capable of being used in a holographic storage system, for example, one described in, commonly assigned U.S. Pat. No. 6,482,551 (Dhar, et al.), issued Nov. 19, 2002, the entire disclosure and contents of which is hereby incorporated by references. The amount of information capable of being stored in a holographic storage medium is proportional to the product of: the refractive index contrast, $\Delta n$, of the photorecording material, the thickness, d, of the photorecording material, etc. The $\Delta n$ is associated with a medium before writing, but may be observed by a measurement performed after recording. Advantageously, embodiments of the holographic storage media of the present invention exhibit a $\Delta n$ of about $3 \times 10^{-3}$ or higher.

In addition to holographic storage media, examples of embodiments of other optical articles of the present invention may include beam or optical filters, beam steerers or deflectors, optical couplers, etc. (See, e.g., L. Solymar et al., *Volume Holography and Volume Gratings*, (Academic Press 1981), pp. 315-27), the entire disclosure and contents of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travels undeflected through the hologram. (See, e.g., J. E. Ludman et al., "Very thick holographic nonspatial filtering of laser beams," *Optical Engineering*, 36, (6), (1997), pp. 1700 et seq., the entire disclosure and contents of which is hereby incorporated by reference.) A beam steerer is a hologram that deflects light incident at the Bragg angle. An optical coupler may be a combination of beam deflectors that steer light from a source to a target. These articles, which may also be referred to as holographic optical elements, may be fabricated by imaging a particular optical interference pattern within a recording medium, as discussed herein. Media for these holographic optical elements may be formed by the techniques discussed herein for recording media or waveguides.

The material principles discussed herein are applicable not only to hologram formation, but also to formation of optical transmission devices such as waveguides. Polymeric optical waveguides are discussed for example in B. Booth, "Optical Interconnection Polymers," in *Polymers for Lightwave and Integrated Optics, Technology and Applications*, (L. A. Hornak, ed., Marcel Dekker, Inc. 1992); U.S. Pat. No. 5,292,620 (Booth et al.), issued Mar. 18, 1994; and U.S. Pat. No. 5,219,710 (Horn et al.), issued Jun. 15 1993, the entire disclosure and contents of which are hereby incorporated by reference. Essentially, the recording material may be irradiated in a desired waveguide pattern to provide refractive index contrast between the waveguide pattern and the surrounding (cladding) material. It may also be possible for exposure to be performed, for example, by a focused laser light, by use of a mask with a non-focused light source, etc. Generally, a single layer may be exposed in this manner to provide the waveguide pattern, and additional layers may be added to complete the cladding, thereby completing the waveguide. This process is discussed for example at pages 235-36 of Booth, supra, and Cols. 5 and 6 of U.S. Pat. No. 5,292,620, supra, the entire disclosure and contents of which is hereby incorporated by reference.

In one embodiment of a holographic storage medium, conventional molding techniques may be used to mold the combination, blend, mixture, etc., of the photoactive index-contrasting monomer attached to a diffusion-controlling matrix framework, photoinitiator, optional polymer support matrix, etc., into a variety of shapes prior to formation of the article by cooling to room temperature. For example, the combination, blend, mixture, etc., of the photoactive index-contrasting monomer to the diffusion-controlling matrix framework, photoinitiator, optional polymer support matrix, etc., may be molded into ridge waveguides, wherein a plurality of refractive index patterns may then be written into the molded structures. It may thereby be possible to easily form structures such as Bragg gratings. This feature may increase the breadth of applications in which such polymeric waveguides would be useful.

In another embodiment of a holographic storage medium, the polymer support matrix may be thermoplastic and allow the holographic storage medium to behave as if it is entirely a thermoplastic. That is, the polymer support matrix allows the holographic storage medium to be processed similar to the way that a thermoplastic is processed, i.e., molded into a shaped form, blown into a film, deposited in liquid form on a substrate or between a pair of substrates, extruded, rolled, pressed, made into a sheet of material, etc., and then allowed to harden at room temperature to take on a stable shape or form. The polymer support matrix may comprise one or more thermoplastics. Suitable thermoplastics may include poly(vinyl acetate), poly(styrene), poly(ethylene), poly(propylene), poly(ethylene oxide), linear nylons, linear polyesters, linear polycarbonates, linear polyurethanes, poly(vinyl chloride), poly(vinyl alcohol-co-vinyl acetate), etc.

In another embodiment, the amount of thermoplastic used in the holographic storage medium may be enough that the entire holographic storage medium effectively acts as a thermoplastic for most processing purposes. The polymer support matrix of the holographic storage medium may make up as much as about 5%, preferably as much as about 50%, and more preferably as much as about 90% of the holographic storage medium by volume. The amount of any given polymer support matrix in the holographic storage medium may vary based on clarity, refractive index, melting temperature, $T_g$, color, birefringence, solubility, etc. of the thermoplastic or thermoplastics that make up the binder component. Additionally, the amount of the polymer support matrix in the holographic storage medium may vary based on the article's final form, whether it is a solid, a flexible film, or an adhesive.

In another embodiment of the holographic storage medium, the polymer support matrix may include a telechelic thermoplastic resin—meaning that the thermoplastic polymer may be functionalized with reactive groups that covalently crosslink the thermoplastic in the polymer support matrix with the photopolymer formed from the photoactive index-contrasting monomer during hologram formation. Such crosslinking may make the holograms stored in the thermoplastic holographic storage medium very stable, even at elevated temperatures for extended periods of time.

Similarly, in another embodiment of the holographic storage medium wherein a thermoset is formed, the polymer support matrix may contain functional groups that copolymerize or otherwise covalently bond with the photoactive index-contrasting monomer used to form the photopolymer. Such polymer support matrix attachment methods may allow for increased archival life of the recorded holograms. Suitable thermoset systems for used herein are disclosed in to U.S. Pat. No. 6,482,551 (Dhar et al.), issued Nov. 19, 2002, the entire disclosure and contents of which is hereby incorporated by reference.

In another embodiment of the holographic storage medium, the thermoplastic polymer support matrix may be crosslinked noncovalently with the polymer formed upon hologram formation by using a functionalized thermoplastic polymer in the polymer support matrix. Examples of such non-covalent bonding include ionic bonding, hydrogen bonding, dipole-dipole bonding, aromatic pi stacking, etc.

In another embodiment, the holographic storage medium may comprise at least one photoactive index-contrasting monomer that can form holograms in the resulting photopolymer when exposed to a photoinitiating light source, such as a laser beam that is recording data pages to the holographic storage medium. The photoactive index-contrasting monomers may include any photoactive monomer, photoactive oligomer, or combination thereof, having the parameters as further described below, that is capable of undergoing photoinduced polymerization, and which, in combination with the polymer support matrix, meets the compatibility requirements of the present invention. Suitable photoactive index-contrasting monomers may include those which polymerize by a free-radical reaction, e.g., molecules containing ethylenic unsaturation (i.e., one or more double bonds), such as acrylates, methacrylates, acrylamides, methacrylamides, styrenes, substituted styrenes, such as methyl styrene, etc., vinyl naphthalenes, substituted vinyl naphthalenes, other vinyl polyaromatics, vinylcyclohexene, vinylcyclohexene dioxide, vinylcyclohexene monoxide, vinyl esters, vinyl ethers, vinyl carbazoles, other vinyl derivatives, cycloalkenes, cyclic ethers (e.g., epoxide, glycidyl ether, allyl glycidyl ether, etc.), cyclic carbonates, cyclic esters, dioxalanes, etc. Free-radical copolymerizable pair systems such as vinyl ether/maleimide, vinyl ether/thiol, acrylate/thiol, vinyl ether/hydroxy, etc., may also be suitable. It may also be possible to use cationically polymerizable systems; a few examples of which include vinyl ethers, alkenyl ethers, allene ethers, ketene acetals, epoxides, etc. Furthermore, anionic polymerizable systems may also be suitable herein. It may also be possible for a single photoactive polymerizable molecule to contain more than one polymerizable functional group. Other suitable photoactive index-contrasting monomers may also include cyclic disulfides and cyclic esters. Photoactive oligomers that may be included in the photoactive index-contrasting monomers to form a holographic grating upon exposure to a photoinitiating light source include oligomers such as oligomeric (ethylene sulfide) dithiol, oligomeric (phenylene sulfide) dithiol, oligomeric (bisphenol A), oligomeric (bisphenol A) diacrylate, oligomeric polyethylene with pendent vinyl ether groups, etc. The photoactive index-contrasting monomer of the holographic storage medium may be monofunctional, difunctional, and/or multifunctional.

In addition to the at least one photoactive index-contrasting monomer, the article comprising the holographic storage medium may contain a photoinitiator. The photoinitiator, upon exposure to relatively low levels of the recording light, chemically initiates the polymerization of the photoactive index-contrasting monomer, thus avoiding the need for direct light-induced polymerization. The photoinitiator generally should offer a source of species that initiate polymerization of the particular photoactive index-contrasting monomer, e.g., photoactive monomer. Typically, from about 0.1 to about 20 vol. % photoinitiator provides desirable results.

A variety of photoinitiators known to those skilled in the art and available commercially are suitable for use in the holographic storage medium. It may be advantageous to use a photoinitiator that is sensitive to light at wavelengths available from conventional laser sources, e.g., the blue and green lines of Ar$^+$ (458, 488, 514 nm) and He—Cd lasers (442 nm), the green line of frequency doubled YAG lasers (532 nm), and the red lines of He—Ne (633 nm), Kr$^+$ lasers (647 and 676 nm), and various diode lasers (290 to 900 nm). One advantageous free radical photoinitiator is bis($\eta$-5-2,4-cyclopentadien-1-yl)bis[2,6-difluoro-3-(1H-pyrrol-1-yl)phenyl]titanium, available commercially from Ciba as Irgacure 784™. Another visible free-radical photoinitiator (which requires a co-initiator) is 5,7-diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. For blue wavelengths, any of the photoinitiators described in commonly assigned U.S. Pat. No. 6,780,546 (Trentler et al.), issued Aug. 24, 2004, the entire disclosure and contents of which is hereby incorporated by reference, may be useful. In the case of cationically polymerizable materials, a cationic photoinitiator may be used, such as a sulfonium salt or an iodonium salt. These cationic photoinitiator salts absorb predominantly in the UV portion of the spectrum, and are therefore typically sensitized with a sensitizer or dye to allow use of the visible portion of the spectrum. An example of an alternative visible cationic photoinitiator is ($\eta_5$-2,4-cyclopentadien-1-yl) ($\eta_6$-isopropylbenzene)-iron (II) hexafluorophosphate, available commercially from Ciba as Irgacure 261.

In many embodiments of the holographic storage medium, the photoinitiators used are sensitive to ultraviolet and visible radiation of from about 200 nm to about 800 nm.

The holographic storage medium may also include additives such as plasticizers for altering the properties thereof including the melting point, flexibility, toughness, diffusibility of the monomers, ease of processibililty, etc. Examples of suitable plasticizers include dibutyl phthalate, poly(ethylene oxide) methyl ether, N,N-dimethylformamide, etc. Plasticizers differ from solvents in that solvents are typically evaporated whereas plasticizers are meant to remain in the holographic storage medium.

Other types of additives that may be used in the liquid mixture of the holographic storage medium are inert diffusing agents having relatively high or low refractive indices. Inert diffusing agents typically diffuse away from the hologram being formed, and can be of high or low refractive index but are typically low. Thus, when the photoactive index-contrasting monomer is of high refractive index, the inert diffusing agent would be of low refractive index, and ideally the inert diffusing agent diffuses to the nulls in an interference pattern. Overall, the contrast of the hologram may be increased. Other additives that may be used in the mixture comprising the holographic storage medium include: pigments, fillers, non-photoinitiating dyes, antioxidants, bleaching agents, mold releasing agents, antifoaming agents, infrared/microwave absorbers, surfactants, adhesion promoters, etc.

In one embodiment of the holographic storage medium, the photoactive index-contrasting monomer comprises less than about 20 volume %. In other embodiments, the photoactive index-contrasting monomer of the holographic storage medium may be less than about 10 volume %, or even less than about 5 volume %. For data storage applications, the photoactive index-contrasting monomer is typically present at about 5 volume %. Factors affecting the amount of polymerizable content needed are generally the desired index contrast and effects from shrinkage of the photoactive index-contrasting monomer upon recording (if it occurs), and so may be selected based on the particular application.

In one embodiment, the holographic storage medium may be used to store volatile holograms. Due to the ability to control the photopolymer chain length in the holographic storage medium, a particular mixture may be tuned to have a very general lifetime for the recorded holograms. Thus, after hologram recording, the holograms may be readable for a defined time period such as a week, a few months, years, etc. Heating the holographic storage medium may also increase such a process of hologram destruction. Examples of applications for using volatile holograms may include: rental movies, security information, tickets (or season passes), thermal history detector, time stamp, temporary personal records, etc.

In one embodiment, the holographic storage medium may be used to record permanent holograms. There are several methods to increase the permanency of recorded holograms. Many of these methods involve placing functional groups on the polymer support matrix that allow for the attachment of the resulting photopolymer to the polymer support matrix during cure. The attachment groups may be vinyl unsaturations, chain transfer sites, or even a polymerization retarder such as a hindered phenol derivative. Otherwise, for increased archival stability of recorded holograms, a multifunctional photoactive index-contrasting monomer may be used which allows for crosslinking of the photopolymer, thus increasing the entanglement of the photopolymer in the polymer support matrix. In one embodiment of holographic storage medium, both a multifunctional photoactive index-contrasting monomer and a polymer support matrix-attached chain transfer agent are used. In this way, the shorter chains that are caused by the polymerization retarder or chain transfer agent do not cause loss of archival life.

An optical article of the present invention may be of any thickness needed. For example the article may be thin for display holography or thick for data storage. For data storage applications, the article may be, for example, from about 1 to about 1.5 mm in thickness, and may be in the form of a film or sheet of holographic storage medium between two substrates with at least one of the substrates having an antireflective coating and may be sealed against moisture and air. An article of the present invention may also be made optically flat via the appropriate processes, such as the process described in U.S. Pat. No. 5,932,045 (Campbell et al.), issued Aug. 3, 1999, the entire disclosure and contents of which is hereby incorporated by reference.

An optical article of the present invention may be used for decorative purposes. For example, the article may be used in gift wrap or in window treatments to provide special artistic tinting or 3D designs. The article may be used in molded parts of automobiles, toys, furniture, appliances, etc. to provide decorative effects. An article of the present invention may also be used to make data storage devices of various sizes and shapes, as a block of material or as part of a coating that is coated on a substrate.

B. Photoactive Index-Contrasting Monomers Having Improved Performance

Embodiments of the photoactive index-contrasting monomers of the present invention may be provided with improved index-contrasting properties relative to the polymer support matrix that these photoactive index-contrasting monomers are present in (e.g., dispersed, dissolved, dispersed, embedded, enclosed, etc., in the polymer support matrix). See commonly assigned U.S. Pat. Appln. No. 2007/0248899 (Cole et al.), published Oct. 25, 2007, the entire disclosure and contents of which is hereby incorporated by reference. These photoactive index-contrasting monomers may have an average index contrast (i.e., relative to the polymer support matrix) of greater than about 0.1 (e.g., greater than about 0.2, for example, greater than about 0.3), a molecular size of at least about 1 nm in at least one spatial dimension, and comprises at least one reactive functional group and at least one index-contrasting group. The performance of embodiments of the photoactive index-contrasting monomers of the present invention in, for example, index contrast applications such as holographic data storage (e.g., hologram recording), holographic optical elements, waveguides, photolithography, etc., may be improved by including one or more of the following parameters: (1) a distance between at least one reactive group and at least one index-contrasting group which is at least equal to the average (i.e., Van der Waals) radius of the index-contrasting group; (2) two or more reactive groups per each molecule of photoactive index-contrasting monomer; (3) an index-contrasting group having a strong chromophore absorption at a wavelength shorter than the recording wavelength, and (4) the photoactive index-contrasting monomer comprises a reactive nanoparticle. Parameters 1, 2, 3 and 4 are described in further detail below.

1. Increasing Distance Between Reactive Group and Index-Contrasting Group

Increasing the distance between the reactive group and the index-contrasting group of the photoactive index-contrasting monomer may lead to an increase in sensitivity. Additional benefits of increasing the distance between the reactive group and the index-contrasting group of the photoactive index-contrasting monomer may include improved solubility in the polymer support matrix, increased archival stability, etc. Embodiments of the photoactive index-contrasting monomers of the present invention having improved performance may include index-contrasting groups that comprise a larger portion of the volume of the photoactive index-contrasting monomer, thus lessening the shrinkage associated with recording holograms.

The index-contrasting group may act as a steric hindrance to the reactive site of the photoactive index-contrasting monomer. Thus, by increasing the distance between the index-contrasting group and the reactive group (for example, by use of a linking moiety), the sensitivity (or reactivity) of the photoactive index-contrasting monomer may be increased. Also, the larger the index-contrasting group, the longer the distance between the index-contrasting group and the reactive group may need to be to have higher sensitivity. For example, two monomers (Chloro-trityl Monomers 1 and 2) shown below are dispersed in a GPX 1500 (hydroxyl)—WE 180 (Isocyanate) polymer support matrix with 0.1 wt. % triphenylphosphine oxide (TPO) as the initiator and 0.5 wt. % dibutyltindilaurate and tested on a holographic planewave tester at the same molar concentration:

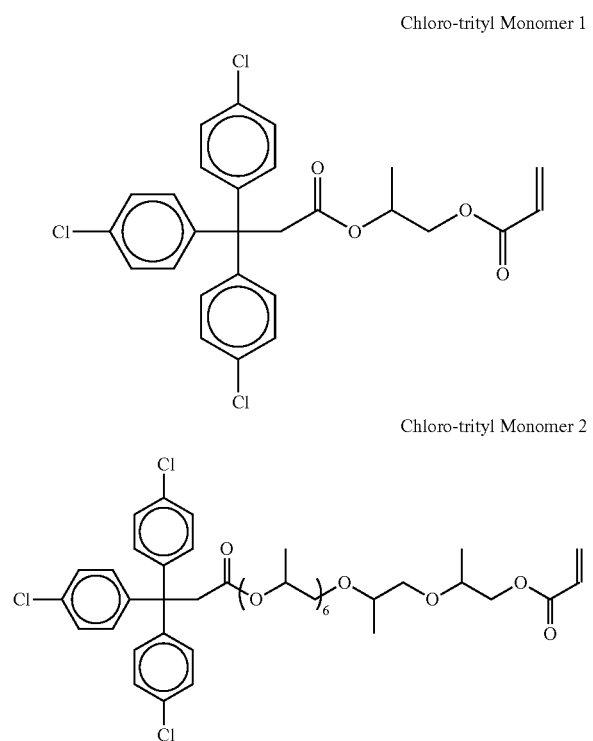

Chloro-trityl Monomer 1

Chloro-trityl Monomer 2

Monomer 1 above has a shorter distance between the index-contrasting group (i.e., the trityl group) and the reactive (i.e., acrylate group), when compared to Monomer 2. When tested, Monomer 2 has 10 times the sensitivity of Monomer 1. Additionally, the archival life of Monomer 2 is greatly improved over Monomer 1, suggesting that more entanglement with the polymer support matrix has occurred. Thus, by increasing the distance between the reactive group and the index-contrasting group, the performance the photoactive index-contrasting monomer may be improved. A suitable distance between at least one of the index-contrasting groups and at least one of the reactive groups may be at least equal to the average radius of the index-contrasting group. For example, a distance which is at least the average diameter of the index-contrasting group may be suitable, such as a distance between the index-contrasting group and the reactive group equal to from about 2 and about 4 diameters of the index-contrasting group. While the index-contrasting group of Monomers 1 and 2 is approximately round, it should be understood that other shapes of index-contrasting groups may occur, but that the average radius (or diameter) may still be used as a general guide for the distance between the reactive group and the index-contrasting group that imparts improved performance to the embodiments of the photoactive index-contrasting monomers of the present invention.

Additionally, the linking moiety between the reactive group and the index-contrasting group may be flexible as this may promote solubility in and entanglement with the polymer support matrix when the photoactive index-contrasting monomer is polymerized to become a photopolymer. It may also be advantageous to choose a linking moiety that will promote solubility in the polymer support matrix used. Non-exhaustive examples of such linking moieties that may be used are shown below:

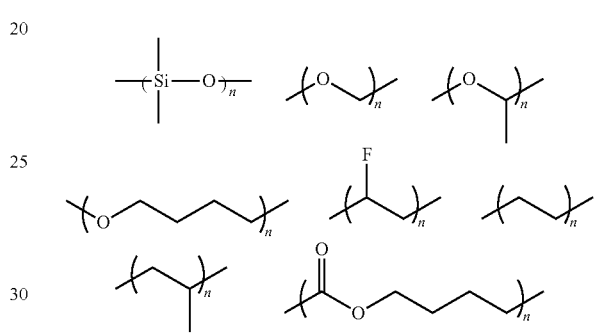

wherein n may be in the range of from 1 to 50, (e.g., from 2 to 10).

For some embodiments of the photoactive index-contrasting monomers of the present invention, the linking moiety itself may also contain index-contrasting group moieties, provided such moieties contribute to the solubility of the photoactive index-contrasting monomer in the polymer support matrix. An illustrative example of such a photoactive index-contrasting monomer (chloro-trityl monomer with a thioether linker) is shown below:

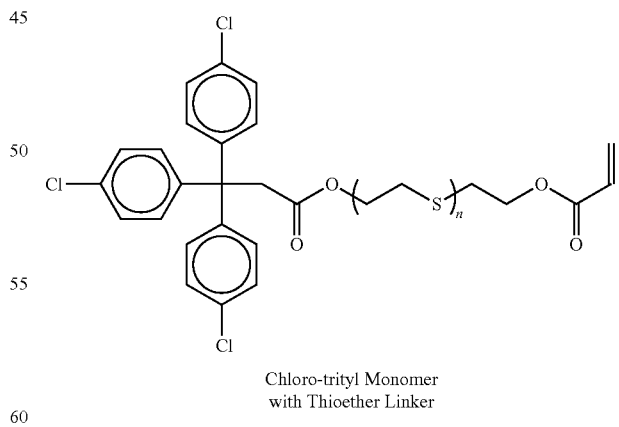

Chloro-trityl Monomer
with Thioether Linker wherein n is in the range of from 1 to 50 (e.g., from 2 to 10). In the chloro-trityl monomer with thioether linker above, the linking moiety (i.e., thioether linker) is not considered a part of the index-contrasting group (i.e., chloro-trityl group) even though it is contributing to the index contrast of the photoactive index-contrasting monomer. Other non-exhaustive examples of suitable linking moieties that also have index-contrasting groups are shown below:

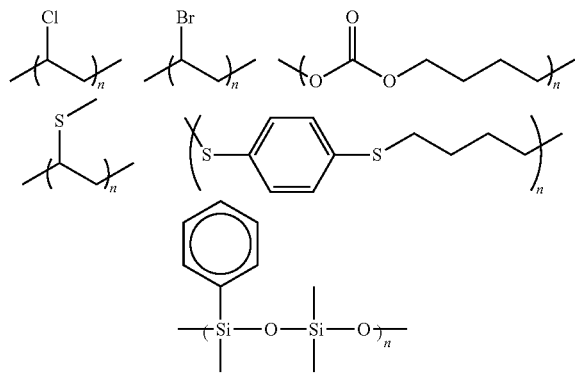

wherein n may be in the range of from 1 to 50, (e.g., from 2 to 10.

Although not required, the linking moiety having the index-contrasting group may also be flexible to promote solubility and sensitivity. Even those linking moieties shown above having, for example, carbonate and aromatic thioether linking moieties may be flexible, since these linking moieties also contain sections or atoms that are flexible. Other linking moieties that may be useful herein include amides, carbamates, etc. The above examples of linking moieties are not meant to be exhaustive, but only exemplary and illustrative of embodiments useful in the present invention. Based on the linking moieties illustrated and describe above, one skilled in the polymer art may determine other suitable linking moieties which would be flexible, would provide photoactive index-contrasting monomers which are soluble in a given polymer support matrix, those which might possibly contain index-contrasting groups, etc.

2. Increasing Number of Reactive Groups Per Molecule of Photoactive Index-Contrasting Monomer Increasing the number of reactive groups per molecule of the photoactive index-contrasting monomer may also increase the archival stability of the formed index-contrasting regions in the resulting photopolymer and the ultimate reactivity (sensitivity) of the photoactive index-contrasting monomer. An increase in the number of reactive groups per molecule may also have benefits other than increasing sensitivity. For example, having more than one reactive group per molecule may lead to enhanced archival stability of the index-contrasting region. A proposed mechanism for such embodiments of the photoactive index-contrasting monomer is that the resulting photopolymer is covalently crosslinked, and is thus essentially a thermoset material. Thermoset materials may be desirable as leading to increased thermal, mechanical, and chemical stability; all of which may be regarded as being desirable for many index contrast applications.

Increasing the number of reactive groups does not always lead to an increase in shrinkage from recording of holograms. For example, by mixing more reactive and less reactive groups (or by providing more hindered reactive groups as described below), not all of the reactive groups may react to form photopolymer chains and thus shrinkage from recording of holograms may be less than would be expected from the number of reactive groups present in the system. Examples of such mixtures of more reactive and less reactive groups may include: an acrylate group with at least one of the following groups: methacrylate, styrene, vinyl ether, or vinyl carbazole; a cyclohexeneoxide group with at least one of the following groups: a vinyl carbazole, a glycidyl ether, an allyl glycidyl ether, a cyclic ester, or a cyclic carbonate; etc.

In small molar concentrations (e.g., under about 10 volume %), multifunctional photoactive index-contrasting monomers (i.e., those having two or more reactive groups) may be able to crosslink enough to be held in place by the polymer support matrix. Although not wishing to be bound by theory, it is believed that the mechanism is related to the formation of rotaxane- or catenane-like structures, or even an interpenetrating network of photopolymer around the polymer support matrix polymer chains. If formed as rotaxane-like structures, even a low degree of polymerization (e.g., such as a degree of polymerization equal to 4), the resulting photopolymer may not be able diffuse away from the reaction site. By contrast, for monofunctional photoactive index-contrasting monomers, a low degree of polymerization of the resultant photopolymer may still permit diffusion away from the reaction sites, thus decreasing resolution and decreasing archival stability. Accurate mimicry of the spatial light intensity may be required for some applications of index contrast (such as holographic data storage), with such accuracy being potentially obtainable from an increase in reactive groups per molecule of the photoactive index-contrasting monomer.

Accordingly, in these embodiments of photoactive index-contrasting monomers of the present invention, the photoactive index-contrasting monomer has at least two reactive groups, for example, more than two reactive groups, per molecule of the photoactive index-contrasting monomer. For example, these embodiments of the photoactive index-contrasting monomers of the present invention may have at least one very reactive group (e.g., a primary acrylate,) and at least one less reactive group (e.g., a methacrylate), for example, two or more very reactive groups and two or more much less reactive groups, per molecule of the photoactive index-contrasting monomer such that the steric bulk of the index-contrasting group controls the degree of polymerization and keeps it, for example, in the range of from about 2 to about 30 units per photopolymer formed. The degree of polymerization may be determined by the volume size of the photoactive index-contrasting monomer. For example, if the photoactive index-contrasting monomer is relatively large (e.g., from about 10 to about 200 nm), a smaller degree of polymerization may be desired. (Limiting the degree of polymerization may limit scatter and phase separation.) Conversely, if the photoactive index-contrasting monomer is relatively small (e.g., from about 1 to about 10 nm), then a larger degree of polymerization may be desired. The overall geometry of the molecules of the photoactive index-contrasting monomer is desirably spherical in shape, but may also be in the form of ovals, short rods, etc.

3. Index-Contrasting Group with Strong Chromophore Absorption at Wavelength Shorter than Recording Wavelength Choosing an index-contrasting group that has a strong chromophore absorption at a wavelength shorter than (e.g., just less than) the recording wavelength, and thus increasing the refractive index of the index-contrasting group (e.g., by using the Kramers-Kronig relationship) may also improve the performance of embodiments of the photoactive index-contrasting monomers of the present invention. In particular, choosing such an index-contrasting group may increase the potential contrast of a photoactive index-contrasting monomer, but without an increase in shrinkage or volume of the photopolymer resulting from such a material (relative to other photoactive index-contrasting monomers that do not have such an index-contrasting group). The effect of an increased refractive index imparted by such index contrasting groups (e.g., by using the Kramers-Kronig relationship) may be accomplished several ways. For example, charge transfer absorptions, band gaps in semiconductors and metals, metal-ligand absorptions, etc., may be used in the photoactive index-contrasting monomer to impart an increased refractive index. Although there are other types of absorptions that may be used to impart an increased refractive index, charge transfer absorptions, band gaps in semiconductors and metals, and metal-ligand absorptions tend to be very strong, with molar extinctions of, for example, greater than about 10,000, and are tunable in wavelength, but absorptions achieving even higher molar extinctions of greater than about 50,000, for example, at least about 100,000, may be possible and even more desirable. By proper tuning to one of these absorptions, a subsequent increase in the refractive index of the photoactive index-contrasting monomer may be realized. To realize this increase in the refractive index, it may be desirable to be on the longer wavelength side of the absorption band. Ideally, the absorption band is very narrow and very strong. The recording wavelength is also selected to be at longer wavelengths than the peak absorption, e.g., on the tail of the absorption. There may also be a trade off, however; for some uses such as high density data storage applications, such that an increase in absorption at the recording or read out wavelength may not desirable. In such uses, it may be desirable that the absorption of the photoactive index-contrasting monomer be below about 20%, (e.g., below about 10%), and in the range of from about 2 to about 5% absorption for a 2 mm thick sample containing the photoactive index-contrasting monomer. It should also be understood that absorption may be thickness dependent for a given concentration of photoactive index-contrasting monomer. Applications that use thinner media may be able go to a higher molar absorbance (and consequently higher refractive indices) at the readout wavelength. See "Kramers-Kronig constrained variational analysis of optical spectra"; A. B. Kuzmenko, Rev. Sci. Instrum., 76, 2005, 083108; "Mid-infrared optical properties of a polymer film: comparison between classical molecular simulations, spectrometry, and ellipsometry techniques"; A. Soldera and E. Monterrat, Polymer, 43, 2002, 6027-6035, the entire disclosure and contents of which are hereby incorporated by reference.

4. Reactive Nanoparticles

Reactive particles comprising photoactive polymerizable materials may also lead to enhanced sensitivity, enhanced dynamic range, reduced scatter, etc. It has been found that crystalline or amorphous clusters of metals, metal oxides, semiconductor materials, insulators (e.g., diamond), inorganic and organic-inorganic salts, and other inorganics, organic particles such as dendrimers, oligomers, hyperbranched polymers, and polymer spheres, etc., may allow for a very high molecular bond refraction per volume of photoactive polymerizable material, which may lead to a higher index contrast and sensitivity. Additionally, these structures may be spherical in shape which may allow for faster diffusion through the support matrix (relative to other shapes of similar volume). Photoactive polymerizable materials in the form of reactive nanoparticles may sometimes not be considered distinct molecules (e.g., may be considered as an association of molecules or nonmolecular solids), however, for the purposes of index contrast applications, these types of materials may be very useful when they have sizes less than about 200 nm (for example, less than about 100 nm and more typically less than about 10 nm) in the longest spatial dimension. The tendency to scatter may be determined by particle size and refractive index, refractive index of the support matrix, and the wavelength of light. Larger sizes may lead to scattering of light and thus may not be as useful for some index contrast applications. Yet, larger particles may also be permissible for longer wavelengths and lesser index contrast between the particle and support matrix. Accordingly, smaller sizes may be used permit a more facile diffusion in the support matrix (especially if crosslinked or rigid).

For embodiments of photoactive polymerizable materials of the present invention in the form of reactive particles that have refractive indices greater than or less than about 0.3 relative to the support matrix refractive index (i.e. differing from or by about 0.3), it may be necessary to limit the degree of polymerization of the photoactive polymerizable material. If the degree of polymerization, or especially if the size of the resultant photopolymer becomes greater than about 50 nm, the photopolymer may scatter light. Therefore, using any of the techniques mentioned herein which may limit the size of the photopolymer may also reduce subsequent scatter. Depending on the refractive index of the photopolymer (and the wavelength of the recording light), the particular size limit of the photopolymer may be determined, and a chain transfer agent, linking moiety length or degree of reactivity of the reactive group (or any combination of these three) may then be used to control the size of the photopolymer.

In another embodiment of such photoactive polymerizable materials, the high index contrast particle may have a shell of lower contrast material. Nanoparticles may be terminated or capped on the outer surface by chemical moieties differing from the repeating units of the core of the nanoparticle. Such moieties may include surfactants, ligands, covalently or ionically bonded or grafted organics, nonbonded or electrostatically attracted polymer encapsulants, nonmolecular inorganic shells (as in core/shell nanoparticles), other surface reconstructions, etc. These caps may be of lower refractive index than the nanoparticle (for nanoparticles of refractive index larger than the support matrix) itself and may be chosen to impart dispersibility, miscibility, solubility, etc., in a medium or matrix, and also to minimize or prevent cluster aggregation and agglomeration or to otherwise stabilize the nanoparticles. Together, the particles and caps may comprise the reactive particle. Multiple types of caps may be employed on a single particle, and the caps may comprise in whole or in part the photoreactive groups of the particles. The reactive groups may also be oriented to the periphery of the reactive particle. The caps may also possess the same refractive index as the support matrix, and may also possess a refractive index gradated from the particle core towards that of the support matrix, as this may tend to blur the index boundary between the particle and the matrix and thereby help diminish light scatter. Also, in certain embodiments, the thickness of the shell material around the photoactive core material may be less than about 4 diameters of the core material, for example, less than about 2 diameters, and more typically a diameter of from about 0.25 to about 0.5 of the diameter of the core material. In general, the larger the index contrast between the photoactive core material and the support matrix, the thicker the shell should be to prevent undesired scatter. It should be understood that the particle may also be of a lower refractive index compared to the support matrix, in which case, the shell would be of a higher refractive index than the core. For making reactive particles, see "Recent Advances in the Liquid-Phase Synthesis of Inorganic Nanoparticles"; Brian L. Cushing, et. al., Chem. Rev. 2004, 104, 3893-3946; "Shape Control of Semiconductor and Metal Oxide Nanocrystals through Nonhydrolytic Colloidal Routes"; Young-wook Jun, et al., Angewandte Chemie Int. Ed., 2006, 45, 3414-3439; "Synthesis Routes for Large Volumes of Nanoparticles";

Ombretta Masala and Ram Seshadri, Annu. Rev. Mater. Res., 2004, 34, 41-81.; "Concepts for the incorporation of inorganic building blocks into organic polymers on a nanoscale"; Guido Kickelbick, Prog. Polym. Sci., 28, 2003, 83-114, the entire disclosures and contents of which are herein incorporate by reference.

In another embodiment, polymerization of the reactive particles may be partially or completely restricted, so that only single units react (e.g., a reactive functional group of the reactive particle binds as a single unit to a corresponding group of the support matrix). Large particle size and refractive index may result in high index contrast and write sensitivity in the absence of a photoamplification mechanism such as a polymerization reaction. In such an event, the possible reactive functional groups of the reactive particles may be expanded from those that may undergo radical, cationic, or anionic chain reactions, to any chemical reaction capable of forming a chemical bond (e.g., covalent, ionic, coordinative, H-bond, etc).

Combinations of more than one of the above-described parameters 1, 2, 3 or 4 may also be used in the embodiments of photoactive polymerizable materials of the present inventions to enhance the performance of the photoactive polymerizable material. For example, embodiments of the photoactive polymerizable material may comprise nanoparticulate metal oxides and metals (parameter 4 above) having strong absorptions that are both tunable and appropriately strong for an increase in refractive index (parameter 3 above), thereby creating smaller photoactive molecules with larger index contrast potential. Also, embodiments of photoactive polymerizable materials having increased distance between index-contrasting and reactive groups (parameter 1 above) formed as reactive nanoparticles (parameter 4 above), with or without index-contrasting groups having a strong chromophore absorption having a wavelength shorter than the recording wavelength (parameter 3 above) may also provide a very sensitive, high contrast photoactive polymerizable materials. Alternatively, embodiments of photoactive polymerizable materials which combine parameters 1, 4, and 3 above may also be formed so that index contrast and sensitivity are relatively high, yet with relatively low scatter.

One or more of the above-described parameters 1, 2, 3 or 4 may also be used combinations with other parameters for enhancing the performance of embodiments of photoactive index-contrasting monomers of the present invention. These other parameters which may lead to increased performance of these photoactive index-contrasting monomers may include: (a) increasing molecular bond refraction per volume of the molecule, thus allowing a high diffraction efficiency and increased dynamic range; (b) increasing the volume of the molecule of the photoactive index-contrasting monomer compared to the reactive group used to form the photopolymer, thus decreasing the shrinkage associated with recording (which may be less of a factor with ring opening reactions); (c) increasing the number of index-contrasting groups per molecule of the photoactive index-contrasting monomer which is a method for accomplishing both parameters (a) and (b); (d) increasing the solubility of both photoactive index-contrasting monomer and its resulting photopolymer in the polymer support matrix, thereby decreasing scatter that may be associated with the formation of the photopolymer within a polymer support matrix; and (e) using two chemistry approaches (i.e., two component systems), i.e., wherein the chemistry used to form the polymer support matrix is substantially independent of the chemistry used by the photoactive index-contrasting monomers to record refractive index structures so that the index contrast between the recording chemistry and the polymer support matrix may be maximized.

In certain embodiments of photoactive index-contrasting monomers of the present invention, one or more of the primary reactive groups (e.g., epoxides, acrylates (e.g., primary acrylates), methacrylates, acrylamides, etc.) may also be altered or modified to increase reactivity, thus increasing sensitivity. When the reactive group is less sterically hindered than another (secondary) reactive group (for a given "class" of reactive groups; the "class" may be an acrylate, an epoxide, a cyclohexylepoxide, a methacrylate, a stryryl, etc.) of the photoactive index-contrasting monomer, sensitivity of the photoactive index-contrasting monomer may be increased. For example, sensitivity of the photoactive index-contrasting monomer may be tuned up or down by the addition (or removal) of steric hindrance at or very near the reactive site.

In certain embodiments of photoactive index-contrasting monomers of the present invention, the functional group(s) on the photoactive index-contrasting monomer may be selected to affect sensitivity, solubility in the polymer support matrix, etc. In addition to controlling the sterics of the photoactive index-contrasting monomers, functional groups may be added to alter the reactivity thereof. For example, it has been found that adding a chain transfer functionality at a reactive site to the photoactive index-contrasting monomer may enable shorter chain lengths to be formed or created, yet allow for crosslinking reactions. In addition, linking moieties, for example, thioether linking moieties, may not only be beneficial as a linking moiety; but may also be beneficial as chain transfer sites which may decrease the degree of polymerization and thus lead to a pseudo-step growth mechanism with little loss in sensitivity. Such chain transfer functionalities may be achieved, for example, by use of an aliphatic thioether, disulfide, aliphatic phosphorous, aliphatic tertiary amine, etc. Furthermore, addition of functional groups to the photoactive index-contrasting monomer that mimic the polymer support matrix may allow for a greater solubility of the photoactive index-contrasting monomer (and the resulting photopolymer therefrom). In certain embodiments, a photoinitiator may be included on the photoactive index-contrasting monomer, which may also allow for crosslinking by effectively adding a reactive site thereto.

In certain embodiments of photoactive index-contrasting monomer of the present invention, the photoactive index-contrasting monomer may be structured such that the reactive groups are partially hindered by steric factors, thus allowing greater control of the degree of polymerization. It has been discovered that by having sterically hindered reactive sites, more reactive sites per molecule may be used without a proportional increase in shrinkage. This may be particularly advantageous for photoactive index-contrasting monomers that undergo chain polymerization. Using this parameter, one may obtain photoactive index-contrasting monomers that normally undergo chain polymerization, but instead undergo pseudo-step growth. With pseudo-step growth, the molecular weight of the resulting photoactive photopolymer remains relatively low. Lower molecular weight photopolymers may increase the likelihood that the photopolymer remains soluble in the polymer support matrix. Solubility of the photopolymer in the polymer support matrix may ensure that the photopolymer will not form scatter centers from phase separation. But if the molecular weight of the photopolymer is too low, the archival stability of the resulting index structure may suffer because insufficient entanglement may occur with the polymer support matrix. By adjusting the relative size of the index-contrasting group(s), relative to the linking moiety length, the ability of the photoactive index-contrasting monomer to form longer chain lengths may be reduced. By adjusting the relative size of the index-contrasting group(s), relative to the linking moiety, the effective chain length of the resulting photopolymer may also be affected. In addition, another effect from increasing the steric bulk around the reactive group(s) is that the sensitivity may decrease because fewer reactions per chain are occurring.

In certain embodiments of photoactive index-contrasting monomer of the present invention, a mixture of hindered and unhindered reactive groups may be used to control the degree of polymerization and sensitivity. The hindered reactive groups may be less likely to be fully polymerized, and thus shrinkage may be reduced from what would be expected by having more reactive groups, as illustrated by (Chloro-Trityl Sorbitol) Monomers 1 and 2 shown below:

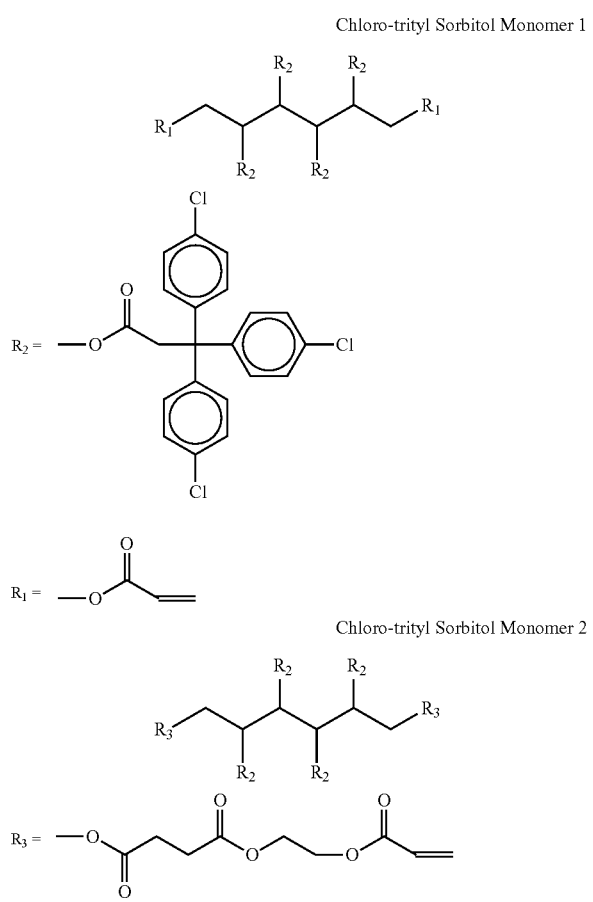

The physical structure of the above Monomers 1 and 2 resemble spheres. Monomer 1 has been found to have an order of magnitude less sensitivity than Monomer 2; and additionally has been found to have ⅓ less shrinkage relative to Monomer 2. This suggests that not all of the acrylate groups on Monomer 1 are polymerized into photopolymer chains when compared to Monomer 2. That the degree of polymerization is least for Monomer 1 is also indicated by neat polymerization of the two monomers, whereby Monomer 1 is significantly less crosslinked compared to Monomer 2, as determined by solvent extraction of respective soluble polymers.

EXAMPLES

Example 1

In a small vial were combined dibutyltin dilaurate (1 ul), GPX1500 (1.6558 g), butanediol monovinylether (0.2412 g) and 2,4,6-tribromophenyl 1-acenaphthylenate (0.0550 g) and the mixture stirred until all components were in solution. XP2410 (1.0449 g) was added and the mixture stirred well and vacuum degassed. The viscous but still liquid mixture was cast between two quartz substrates having spacers of approximately 100 um thickness and allowed to cure in a 60 C oven overnight. The resulting media was irradiated with a uniform intensity light source using wavelengths>400 nm until the characteristic UV-Visible spectrum of the acenaphthylene was no longer detectable.

Example 2

In a small vial were combined Terathane 1000 (3.0027 g), Compound A (0.0624 g) and TPO (0.0078 g) and the mixture stirred until solution was complete. DBU (0.0032 g) was added with stirring and the solution immediately became yellow. XP2410 (0.9892 g) was added and the initially turbid mixture stirred well and vacuum degassed until the mixture became clear and homogeneous. This was cast between glass slides having spacers of approximately 200 um thickness and cured in a 60 C oven overnight.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:
1. An article comprising an optical medium comprising:
a diffusion-controlling matrix framework;
at least one photoactive monomer attached to said diffusion-controlling matrix framework in a first state of said optical medium;
wherein said at least one photoactive monomer is released from said diffusion-controlling matrix framework by photo cleavage, producing a second state of said optical medium, to provide diffusion of said photoactive monomer through said optical medium when exposed to photo cleaving light;
wherein said at least one photoactive monomer is polymerized or reattached to said diffusion-controlling matrix, in a third state of said optical medium, when exposed to photo-polymerizing light; and
wherein said photoactive monomer comprises:

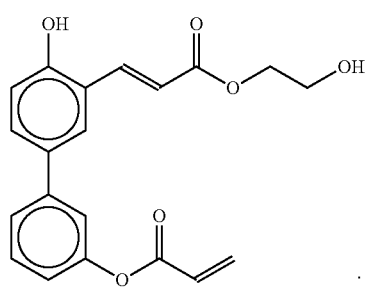

2. The article of claim 1, wherein said photoactive monomer is a photoactive index-contrasting monomer.

3. The article of claim 1, wherein said diffusion-controlling matrix framework comprises a polymer support matrix.

4. The article of claim 3, wherein said polymer support matrix comprises a thermoset polymer.

5. The article of claim 3 wherein said polymer support matrix comprises a thermoplastic.

6. The article of claim 1, further comprising at least a pair of substrates and wherein said optical medium is positioned between said at least a pair of substrates.

7. The article of claim 6, wherein at least one of said at least a pair of substrates comprises glass.

8. The article of claim 6, wherein at least one of said at least a pair of substrates comprises plastic.

9. The article of claim 1, wherein said optical medium is an optical waveguide.

10. The article of claim 1, wherein said photoactive monomer can undergo a reverse photoaddition reaction.

11. The article of claim 10, wherein said photoactive monomer can undergo a reversible photocycloaddition reaction.

12. The article of claim 11, wherein said photoactive monomer comprises a polyaromatic hydrocarbon moiety or a cycloalkyl derivative of a polyaromatic hydrocarbon moiety.

13. The article of claim 12, wherein said photoactive monomer comprises a cycloalkyl derivative of a polyaromatic hydrocarbon moiety selected from the group consisting of cycloalkylacenaphthylene-containing moieties, and cycloalkylphenanthrene-containing moieties.

14. The article of claim 12, wherein said photoactive monomer comprises a cycloalkylacenaphthylene-containing moiety.

15. The article of claim 11, wherein said diffusion-controlling matrix framework comprises one or more vinyl groups.

16. The article of claim 11, wherein said diffusion-controlling matrix framework comprises one or more vinyl ether groups.

17. The article of claim 10, wherein said photoactive monomer undergoes only a reverse photoaddition reaction to release said photoactive monomer from said diffusion-controlling matrix framework.

18. The article of claim 1, further comprising at least a pair of substrates and wherein said optical medium is positioned between said at least a pair of substrates and wherein said optical medium is an optical waveguide.

19. The article of claim 1, wherein said diffusion-controlling matrix framework comprises a polyurethane having one or more functional isocyanate groups.

20. The article of claim 1, wherein said diffusion-controlling matrix framework comprises a thermoset polyurethane.

21. The article of claim 1, wherein said optical medium is a holographic storage medium.

22. The article of claim 1, wherein said photo cleavage can be achieved using light having a wavelength of between 260 nm and 320 nm.

23. The article of claim 1, wherein said photo cleavage can be achieved using light having a wavelength of between 290 nm and 310 nm.

24. The article of claim 1, wherein said polymerization or reattachment can occur using light having a wavelength of between 370 nm and 450 nm.

25. The article of claim 1, wherein said polymerization or reattachment can occur using light having a wavelength of between 395 nm and 415 nm.

26. An article comprising a holographic storage medium comprising:

a diffusion-controlling matrix framework;

at least one photoactive index-contrasting monomer attached to said diffusion-controlling matrix framework in a first state of said holographic storage medium;

wherein said at least one photoactive index-contrasting monomer is released from said diffusion-controlling matrix framework by photo cleavage, producing a second state of said holographic storage medium, to provide diffusion of said photoactive index-contrasting monomer through said holographic storage medium when exposed to photo cleaving light;

wherein said at least one photoactive index-contrasting monomer is polymerized with said diffusion-controlling matrix, in a third state of said holographic storage medium, when exposed to photo-polymerizing light; and wherein said photoactive monomer comprises:

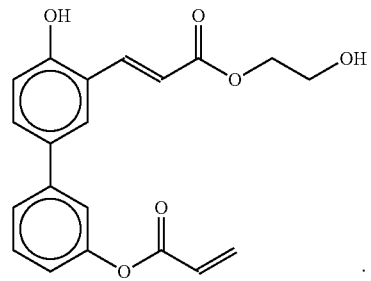

27. The article of claim 26, wherein said diffusion-controlling matrix framework comprises a polymer support matrix.

28. The article of claim 27, wherein said polymer support matrix comprises a thermoset polymer.

29. The article of claim 27 wherein said polymer support matrix comprises a thermoplastic.

30. The article of claim 26, further comprises at least a pair of substrates and wherein said optical medium is positioned between said at least a pair of substrates.

31. The article of claim 30, wherein at least one of said at least a pair of substrates comprises glass.

32. The article of claim 30, wherein at least one of said at least a pair of substrates comprises plastic.

33. The article of claim 26, wherein said optical medium is an optical waveguide.

34. The article of claim 26, wherein said photoactive index-contrasting monomer can undergo a reversible photoaddition reaction.

35. The article of claim 34, wherein said photoactive index-contrasting monomer can undergo a reversible photocycloaddition reaction.

36. The article of claim 35, wherein said photoactive index-contrasting monomer comprises a polyaromatic hydrocarbon moiety or a cycloalkyl derivative of a polyaromatic hydrocarbon moiety.

37. The article of claim 36, wherein said photoactive index-contrasting monomer comprises a cycloalkyl derivative of a polyaromatic hydrocarbon moiety selected from the group consisting of cycloalkylacenaphthylene-containing moieties, and cycloalkylphenanthrene-containing moieties.

38. The article of claim 36, wherein said photoactive index-contrasting monomer comprises a cycloalkylacenaphthylene-containing moiety.

39. The article of claim 35, wherein said diffusion-controlling matrix framework comprises one or more vinyl groups.

40. The article of claim 35, wherein said diffusion-controlling matrix framework comprises one or more vinyl ether groups.

41. The article of claim 34, wherein said photoactive index-contrasting monomer undergoes only a reverse photoaddition reaction to release said photoactive index-contrasting monomer from said diffusion-controlling matrix framework.

42. The article of claim 26, further comprising at least a pair of substrates and wherein said optical medium is positioned between said at least a pair of substrates and wherein said optical medium is an optical waveguide.

43. The article of claim 26, wherein said diffusion-controlling matrix framework comprises a polyurethane having one or more functional isocyanate groups.

44. The article of claim 26, wherein said diffusion-controlling matrix framework comprises a thermoset polyurethane.

45. The article of claim 26, wherein said polymerization or reattachment can occur using light having a wavelength of between 300 nm and 425 nm.

46. The article of claim 26, wherein said polymerization or reattachment can occur using light having a wavelength of between 400 nm and 410 nm.

47. The article of claim 26, wherein said photo cleavage can be achieved using light having a wavelength of between 425 nm and 500 nm.

48. The article of claim 26, wherein said photo cleavage can be achieved using light having a wavelength of between 435 nm and 450 nm.

49. An article comprising a holographic storage medium comprising:
   a diffusion-controlling matrix framework;
   at least one photoactive index-contrasting monomer attached to said diffusion-controlling matrix framework in a first state of said holographic storage medium;
   wherein said at least one photoactive index-contrasting monomer is released from said diffusion-controlling matrix framework by photo cleavage, producing a second state of said holographic storage medium, to provide diffusion of said photoactive index-contrasting monomer through said holographic storage medium when exposed to photo cleaving light;
   wherein said at least one photoactive index-contrasting monomer is polymerized with said diffusion-controlling matrix, in a third state of said holographic storage medium, when exposed to photo-polymerizing light; and
   wherein said photo cleavage can be achieved using light having a wavelength of between 425 nm and 500 nm.

50. An article comprising a holographic storage medium comprising:
   a diffusion-controlling matrix framework;
   at least one photoactive index-contrasting monomer attached to said diffusion-controlling matrix framework in a first state of said holographic storage medium;
   wherein said at least one photoactive index-contrasting monomer is released from said diffusion-controlling matrix framework by photo cleavage, producing a second state of said holographic storage medium, to provide diffusion of said photoactive index-contrasting monomer through said holographic storage medium when exposed to photo cleaving light;
   wherein said at least one photoactive index-contrasting monomer is polymerized with said diffusion-controlling matrix, in a third state of said holographic storage medium, when exposed to photo-polymerizing light; and
   wherein said photo cleavage can be achieved using light having a wavelength of between 435 nm and 450 nm.

* * * * *